United States Patent
Lee et al.

(10) Patent No.: US 9,899,487 B2
(45) Date of Patent: Feb. 20, 2018

(54) SEMICONDUCTOR DEVICES AND METHODS OF MANUFACTURING THE SAME

(71) Applicant: Samsung Electronics Co., Ltd., Suwon-si, Gyeonggi-do (KR)

(72) Inventors: Myeong-Dong Lee, Seoul (KR); Hye-Young Kang, Anyang-si (KR); Young-Sin Kim, Hwaseong-si (KR); Yong-Kwan Kim, Yongin-si (KR); Byoung-Wook Jang, Seoul (KR); Augustin Jinwoo Hong, Seoul (KR); Dong-Sik Kong, Hwaseong-si (KR); Chang-Hyun Cho, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/404,703

(22) Filed: Jan. 12, 2017

(65) Prior Publication Data
US 2017/0263723 A1   Sep. 14, 2017

(30) Foreign Application Priority Data
Mar. 8, 2016   (KR) .................... 10-2016-0027435

(51) Int. Cl.
*H01L 27/148*   (2006.01)
*H01L 29/80*   (2006.01)
(Continued)

(52) U.S. Cl.
CPC ...... *H01L 29/4236* (2013.01); *H01L 29/0642* (2013.01); *H01L 29/66666* (2013.01); *H01L 29/7827* (2013.01)

(58) Field of Classification Search
CPC ............. H01L 29/4236; H01L 29/7827; H01L 29/66621; H01L 29/66666;
(Continued)

(56) References Cited

U.S. PATENT DOCUMENTS

| 8,153,489 B2 | 4/2012 | Song |
| 8,399,917 B2 | 3/2013 | Yeom |

(Continued)

FOREIGN PATENT DOCUMENTS

| KR | 101094956 B1 | 12/2011 |
| KR | 101096215 B1 | 12/2011 |

*Primary Examiner* — Hsien Ming Lee
(74) *Attorney, Agent, or Firm* — Harness, Dickey & Pierce, P.L.C.

(57) ABSTRACT

A semiconductor device may include a linear gate trench that crosses an active region of a substrate of the semiconductor device. The active region may include a plurality of gate areas at a bottom of the gate trench and junction areas at a surface of the substrate in a central portion and opposite end portions of the active region. A conductive line may be in a lower portion of the gate trench. The conductive line may include a gate line and a capping layer that at least partially isolates the gate line from an upper surface of the conductive line. A sealing line may be in an upper portion of the gate trench. The sealing line may cover the conductive line and a surface of the sealing line may be coplanar with the junction areas.

16 Claims, 32 Drawing Sheets

(51) Int. Cl.
*H01L 29/76* (2006.01)
*H01L 29/94* (2006.01)
*H01L 21/336* (2006.01)
*H01L 29/423* (2006.01)
*H01L 29/06* (2006.01)
*H01L 29/66* (2006.01)
*H01L 29/78* (2006.01)

(58) Field of Classification Search
CPC ........... H01L 29/66348; H01L 29/7395; H01L 29/7397; H01L 29/407; H01L 29/42356; H01L 29/66628; H01L 29/7394; H01L 29/7813; H01L 27/10876; H01L 27/10823; H01L 27/0886; H01L 27/0924; H01L 27/10841; H01L 21/76877; H01L 21/76879; H01L 21/823431; H01L 21/823487; H01L 21/823821; H01L 21/823885
USPC ........ 438/259, 270, 361; 257/135, 220, 263, 257/302, 330, 331
See application file for complete search history.

(56) References Cited

U.S. PATENT DOCUMENTS

| | | |
|---|---|---|
| 8,610,191 B2 | 12/2013 | Moon et al. |
| 8,674,420 B2 | 3/2014 | Yeom |
| 8,753,935 B1 | 6/2014 | Bobde et al. |
| 8,951,867 B2 | 2/2015 | Lee et al. |
| 2015/0056772 A1 | 2/2015 | Kim et al. |
| 2016/0197084 A1* | 7/2016 | Yoon ................. H01L 27/10876 438/270 |
| 2016/0315088 A1* | 10/2016 | Kang ................ H01L 27/10814 |

\* cited by examiner

SEMICONDUCTOR DEVICES AND METHODS OF MANUFACTURING THE SAME

CROSS-REFERENCE TO RELATED APPLICATIONS

This application claims priority under 35 U.S.C. § 119 to Korean Patent Application No. 10-2016-0027435 filed on Mar. 8, 2016 in the Korean Intellectual Property Office, the contents of which are incorporated by reference herein in its entirety.

BACKGROUND

1. Field

Example embodiments relate to semiconductor devices and methods of manufacturing the same, and more particularly, to buried channel array transistors (BCAT) and methods of manufacturing the same.

2. Description of the Related Art

As designs of manufactured semiconductor devices have been downsized and more highly-integrated over time, the pattern width associated with semiconductor devices has been reduced and the channel length has been shortened associated with semiconductor devices in cell transistors included in the semiconductor devices. In some cases, a difficulty associated with manufacturing semiconductor devices configured to obtain a sufficient refresh time of memory devices has increased due to a short channel effect that may result from reduced pattern width and channel length associated with the semiconductor devices.

A recess channel array transistor (RCAT) has been introduced for obtaining a sufficient effective channel length. In some example embodiments, the RCAT frequently fails by a high gate-induced drain leakage (GIDL). A buried channel array transistor (BCAT) has been proposed in such a way that the surface of the gate electrode is positioned below the surface of the silicon substrate to thereby reduce and/or minimize the GIDL of the RCAT.

In some example embodiments, the word lines of the BCAT tend to be arranged in a 6 $F^2$ (F: minimum feature size) layout and the pitch of the word lines can be reduced to about 0.5 F, the occupation area of each cell transistor can be remarkably reduced using this arrangement. Accordingly, both of the effective channel length and the chip size can be reduced in memory devices by using the BCAT.

SUMMARY

Some example embodiments of the present inventive concepts provide a semiconductor device in which a height of the gate insulation pattern is reduced and an insulating sealing line covering the lowered gate insulation pattern and a capping line on a gate line is further provided, thereby limiting and/or preventing a bridge defect between contact structures on the source and drain regions of the active region.

Some example embodiments of the present inventive concepts provide a method of manufacturing the above semiconductor devices.

According to some example embodiments of the inventive concepts, a semiconductor device may include: a substrate including an active region at least partially defined by a device isolation layer and at least one gate trench, the at least one gate trench linearly extending in a first direction to cross the active region, the active region including, a plurality of gate areas at a bottom of the gate trench, a first junction area at a surface of the substrate in a central portion of the gate trench, and a second junction area at a surface of the substrate at opposite end portions of the gate trench; a first conductive line located in the gate trench, the first conductive line extending in the first direction, the first conductive line including, a gate line in a lower portion of the gate trench, and a capping line on the gate line in the gate trench; and a sealing line located in an upper portion of the gate trench, the sealing line extending in the first direction, the sealing line being on the first conductive line such that an upper surface of the sealing line is substantially coplanar with an upper surface of the first junction area and an upper surface of the second junction area.

According to some example embodiments of the inventive concepts, a method of manufacturing a semiconductor device may include: providing a substrate having at least an active region at least partially defined by a device isolation layer; forming a gate trench on the substrate to cross the active region, according to an etching process using a mask pattern, such that the active region is divided into, a plurality of gate areas at a bottom of the gate trench and lower than an upper surface of the substrate, a first junction area at an upper surface of the substrate in a central portion of the gate trench, and a plurality of second junction areas at the upper surface of the substrate at opposite end portions of the gate trench; forming a first conductive line in a lower portion the gate trench, the first conductive line extending in the first direction, the first conductive line including a gate line and a capping line on the gate line are in the lower portion of the gate trench; and forming a sealing line in an upper portion of the gate trench, the sealing line extending in the first direction on the first conductive line such that an upper surface of the sealing line is substantially coplanar with an upper surface of the first junction area and upper surfaces of the second junction areas.

According to some example embodiments of the present inventive concepts, a semiconductor device may include: a substrate including an active region at least partially defined by a device isolation layer and at least one gate trench, the at least one gate trench linearly extending in a first direction to cross the active region; and a first conductive line located in the gate trench, the first conductive line extending in the first direction, the first conductive line including, a gate line in a lower portion of the gate trench, and a capping line on the gate line in the gate trench, such that an upper surface of the first conductive line at least partially includes an upper surface of the capping line, and the capping layer isolates the gate line from the upper surface of the first conductive line.

According to some example embodiments of the present inventive concepts, a semiconductor device may include: a substrate including an active region at least partially defined by a device isolation layer and at least one gate trench, the at least one gate trench linearly extending in a first direction to cross the active region; a first conductive line located in the gate trench, the first conductive line extending in the first direction, the first conductive line including, a gate line in a lower portion of the gate trench, and a capping line on the gate line in the gate trench; and a sealing line located in an upper portion of the gate trench, the sealing line extending in the first direction, the sealing line covering an entirety of an upper surface of the first conductive line.

Thus, an etching process for forming a contact hole through which the drain junction may be exposed may be performed with a sufficient process margin due to the increased insulation thickness around the drain junction, thereby increasing the stability and reliability of the bit line contact making contact with the drain junction. In some example embodiments, if and/or when the capping line and the sealing may be vertically stacked on the gate line in the gate trench, the gate line may be sufficiently protected in the etching process for forming a bit line contact hole, thereby limiting and/or preventing the damage to the gate line in the etching process.

In some example embodiments, no residuals of the gate insulation pattern may be found around the drain junction after the etching process for forming the bit line contact hole, the bit line contact may be sufficiently limited and/or prevented from making contact with the residuals of the gate insulation pattern around the drain junction. Thus, the operation reliability of the semiconductor device may not be deteriorated in spite of the high integration degree and size reduction of the semiconductor device.

BRIEF DESCRIPTION OF THE DRAWINGS

These and other features of the inventive concepts will become more apparent by describing in detail some example embodiments thereof with reference to the accompanying drawings of which.

DETAILED DESCRIPTION

Figure 1:
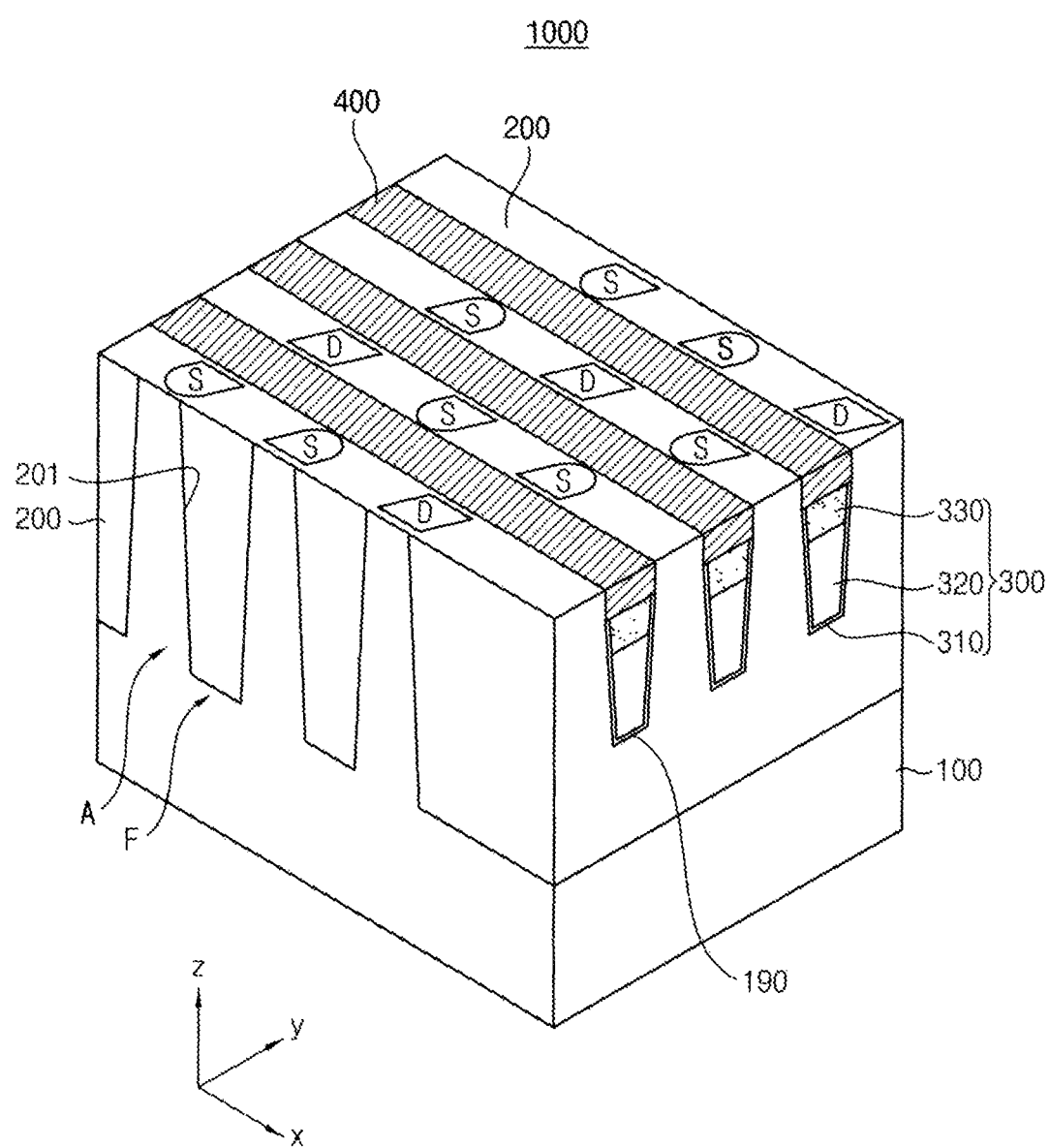
FIG. 1 is a perspective view illustrating a semiconductor device in accordance with some example embodiments of the present inventive concepts.

Reference will now be made to example embodiments, which are illustrated in the accompanying drawings, wherein like reference numerals may refer to like components throughout.

Figure 2:
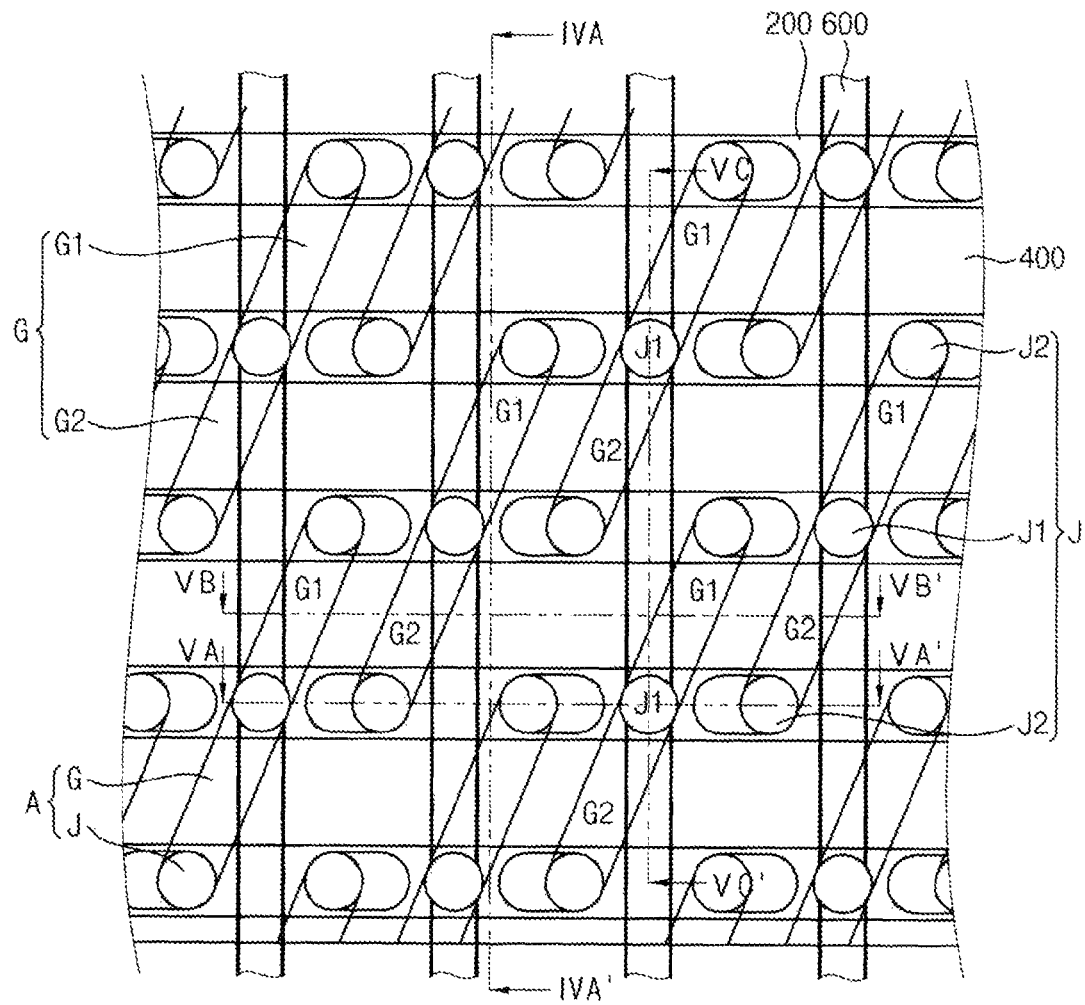
FIG. 2 is a layout of the semiconductor device shown in FIG. 1.
Figure 3:
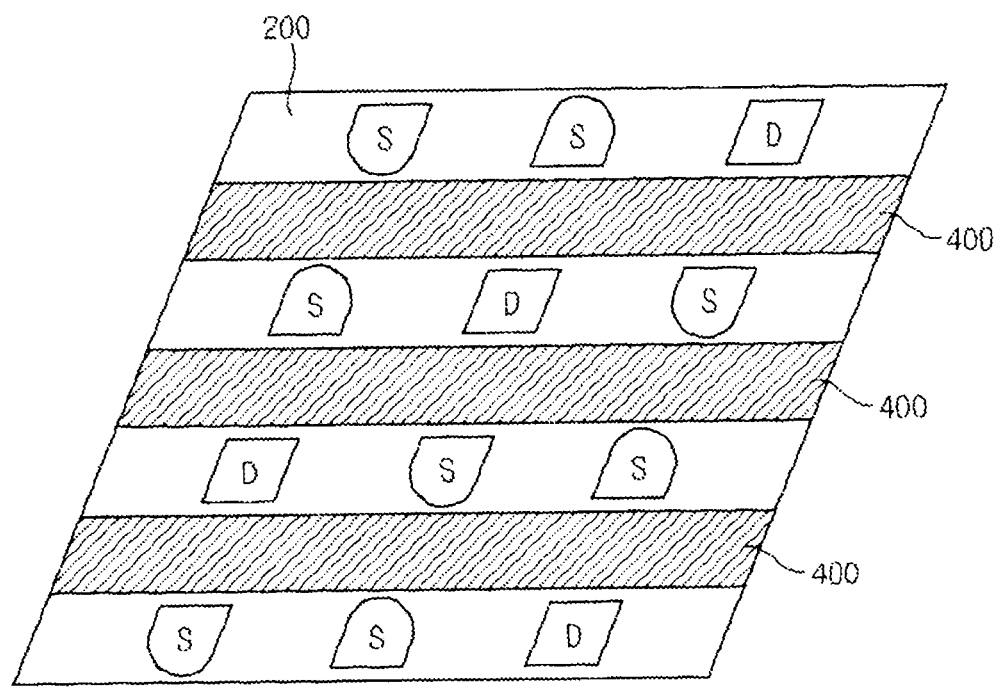
FIG. 3 is a plan view of the semiconductor device shown in FIG. 1.
Figure 4A:
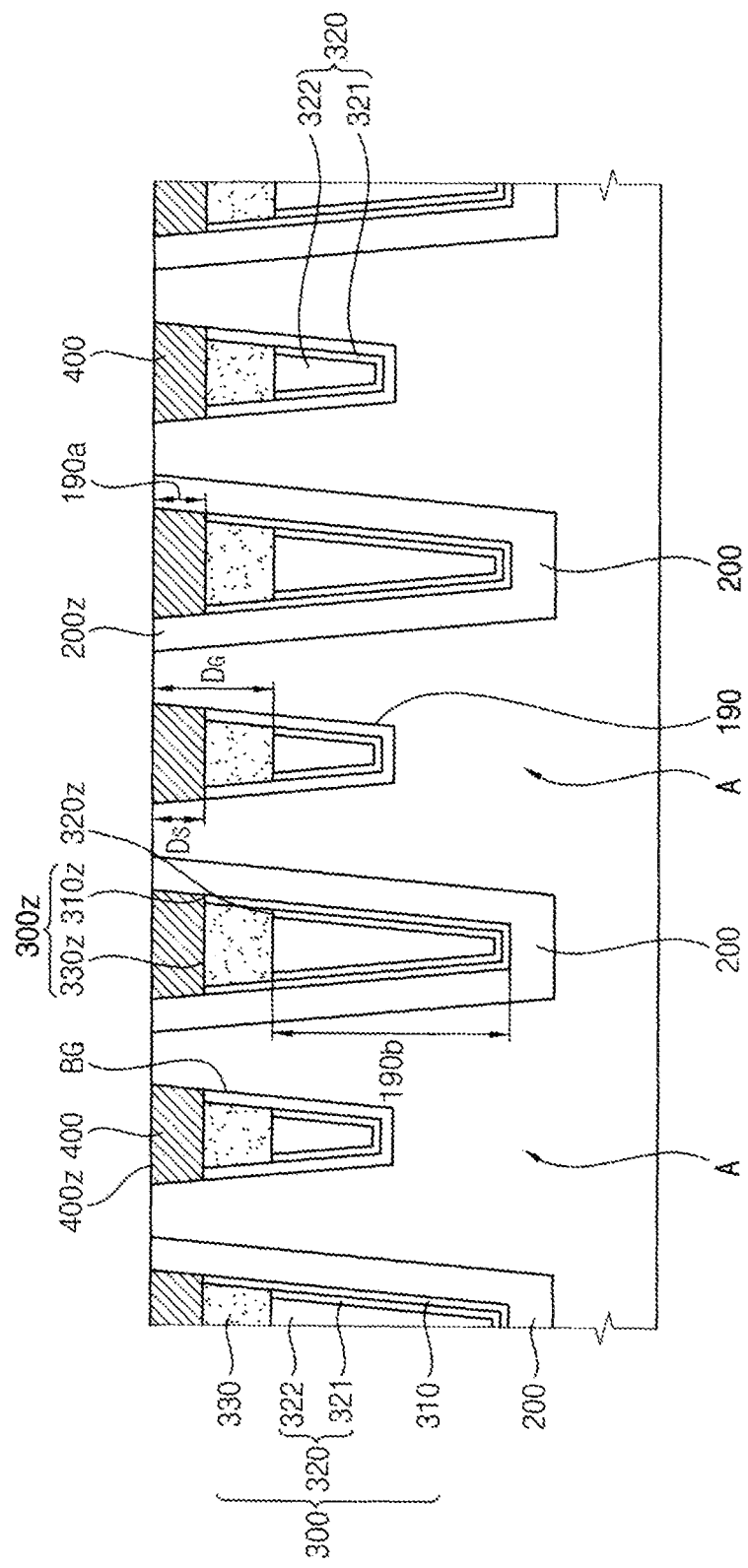
FIG. 4A is a cross-sectional view of the semiconductor device shown in FIG. 1 cut along a line IVA-IVA' of the layout shown in FIG. 2.

FIG. 1 is a perspective view illustrating a semiconductor device in accordance with some example embodiments of the present inventive concepts, and FIG. 2 is a layout of the semiconductor device shown in FIG. 1. FIG. 3 is a plan view of the semiconductor device shown in FIG. 1. FIG. 4A is a cross-sectional view of the semiconductor device shown in FIG. 1 cut along a line IVA-IVA' of the layout shown in FIG. 2.

Referring to FIGS. 1 to 4A, the semiconductor device 1000 in accordance with some example embodiments may include a substrate 100 having an active region A defined by a device isolation layer 200 and at least one gate trench 190 linearly extending in a first direction x to cross the active region A, a first conductive line 300 located in the gate trench 190 and extending in the first direction x, and a sealing line 400 filling (e.g., "located in," "occupying," etc.) an upper portion 190a of the gate trench 190 in the first direction x and covering the first conductive line 300 (e.g., covering an upper surface of the first conductive line). As shown in the example embodiments illustrated in at least FIG. 2, the active region A may include two or more gate areas G at a bottom of the gate trench 190, a first junction area J1 at a surface of the substrate 100 in a central portion of the active region A and a second junction area J2 at a surface of the substrate 100 at opposite end portions of the active region A. As shown in the example embodiments illustrated in at least FIG. 1 and FIG. 4A, the first conductive line 300 may include a gate line 320 filling in a lower portion of the gate trench 190 and a capping line 330 covering the gate line 320 in the gate trench 190. A surface of the sealing line 400 (e.g., an upper surface 400z thereof) may be coplanar or substantially coplanar (e.g., coplanar within manufacturing tolerances and/or material tolerances) with respective surfaces (e.g., upper surfaces) of the first and the second junction areas J1 and J2.

The substrate 100 may include a semiconductor substrate that may include, for example, a silicon substrate, a silicon-germanium substrate and a silicon-on-insulator (SOI) substrate and may be classified into an active region A, on which conductive structures may be located, and a field region F defining the active region A. The device isolation layer 200 may be provided with the field region F, thus the neighboring conductive structures on the adjacent active region A may be electrically isolated from each other by the device isolation layer around the active region A.

In some example embodiments, the device isolation layer 200 (e.g., a silicon oxide layer) may be provided on the field region F of the substrate 100 by a device isolation process such as a shallow-trench isolation (STI) process, such that a portion of the device isolation layer 200 on a field region F may be in a device isolation trench 201. Thus, the neighboring gate structures on the active region A may be electrically insulated from one another by the device isolation layer 200.

The field region F may decrease in size according to a size reduction of the semiconductor device 1000, particularly in a cell area rather than a peripheral area of the substrate 100, so that some of the device isolation trenches 201 may be insufficient for completely filling up with the insulation materials of the device isolation layer 200. For that reason, in some example embodiments, the device isolation trench 201 may be filled up just with a sidewall oxide layer or a dual stack layer of the sidewall oxide layer and a liner covering a sidewall of the device isolation trench 201. In some example embodiments, some of the device isolation trenches 201 may be filled up with the sidewall oxide layer and without another layer or liner, so a silicon oxide layer may be provided as the device isolation layer 200. Other device isolation trenches 201 may be filled up with the sidewall oxide layer and the liner, so a silicon nitride layer enclosed by the silicon oxide layer may be provided as the device isolation layer 200.

The gate trench 190 may extend on the substrate 100 having a plurality of the active regions A linearly in the first direction x and a number of the linear trenches 190 may be uniformly spaced apart by a same gap distance in the second direction y.

The cross points of the active regions A with the trenches 190 may be partially removed from the substrate 100 in an etching process for forming the gate trench 190 in such a configuration that a top surface of the cross point of the active region A (cross surface of the active region A) may be arranged at a bottom surface of the gate trench 190, while a top surface of the active region A interposed between the neighboring trenches 190 (neighboring surface of the active region A) may remain unchanged in the etching process. Thus, the cross surfaces may be lower than the neighboring surfaces and the cross surface and the neighboring surface may be alternately arranged along the line-shaped active region A. For example, the cross surface and the neighboring surface may be vertically separated from each other by a stepped portion. A gate electrode may be arranged on the cross surface of the active region A and source/drain electrodes may be arranged on the neighboring surfaces of the active region A, so that the cross surface of the active region A may function as a gate area G and the neighboring surfaces of the active region A may function as a junction area J.

The gate structure on the cross surface of the active region A may be lower than the neighboring surface or the top surface of the substrate 100 and may be buried in the gate trench 190 by the capping line 330 and the sealing line 400. That is, the gate structure on the gate area G may be provided as a buried gate structure BG.

In some example embodiments, the device isolation layer 200 may be lower than the gate area G of the active region A along the gate trench 190, so that the gate area G of the active region A may protrude out of the device isolation layer 200 at the bottom of the gate trench 190 and the bottom of the gate trench 190 may be uneven.

In some example embodiments, the active region A may extend in a line shape (referred to as active line) slanting with respect to the first and the second directions x and y. Thus, a single line of the active region A may cross a pair of the neighboring trenches 190.

Therefore, a single active region A may be separated into a pair of gate areas G1 and G2 that may be positioned at the bottoms the neighboring trenches 190, respectively, and first and second junction areas J1 and J2 that may be positioned at the surface of the substrate 100 around the gate trench 190. Impurities may be implanted into the first and the second junction areas J1 and J2 by an ion implantation process, and junction layers for source and drain electrodes may be provided around the gate areas G. A channel layer of the buried gate structure BG may be electrically connected with the junction layers.

Thus, a pair of the gate structures may be arranged on the gate areas G of a single active region A and a first junction area J1, which may be positioned at a central portion of the active region A between the gate structures, may be provided as a drain region adjacent to the gate structure. An interconnector such as a direct contact DC may be arranged on the drain region and may be connected to a second conductive line such as a bit line. Further, a pair of second junction areas J2, which may be positioned at an end portion of the active region A, may be provided as a source region adjacent to the gate structure. Another interconnector such as a buried contact BC may be arranged on the source region and may be connected to a charge storage element such as a capacitor.

A plurality of the gate structures in the same gate trench 190 may be connected to a single line extending in the first direction x as the first conductive line 300 functioning as a word line of the semiconductor device 1000.

For example, the first conductive line 300 may include a gate line 320 extending in the first direction x and having a plurality of the gate structures that may be positioned on the respective gate area G and a capping line 330 that may be arranged on (e.g., at least partially covering) the gate line 320 in the gate trench 190.

A gate insulation pattern 310 may cover the uneven bottom of the gate trench 190, a sidewall of the junction area J and a sidewall of the device isolation layer 200 and the gate line 320 may be arranged on the gate insulation pattern 310 and may fill up (e.g., occupy an entirety or substantial entirety of) or at least partially fill up (e.g., at least partially occupy) a lower portion 190b of the gate trench 190 along the first direction x.

In some example embodiments, the gate insulation pattern 310 may comprise silicon oxide and the gate conductive layer 320 may comprise conductive metal such as tungsten (W), titanium (Ti) and tantalum (Ta). In some example embodiments, the gate line 320 may include a barrier layer 321 making contact with the gate insulation pattern 310 and a metal layer 322 making contact with the barrier layer 321. For example, the barrier layer 321 may comprise titanium nitride (TiN) and the metal layer 322 may comprise tungsten (W).

In some example embodiments, an upper surface 310z of the gate insulation pattern 310 may be lower than the junction area J and an upper surface 320z of the gate line 320 may be lower than the upper surface 310z of the gate insulation pattern 310. Thus, the gate line 320 may be sufficiently enclosed with the gate insulation pattern 310 in the gate trench 190 and no gate insulation pattern may be provided with an upper sidewall of the gate trench. In some example embodiments, the gate line 320 may be at least partially isolated from the upper surface 300z of the first conductive line 300 by at least one of the gate insulation pattern 310 and the capping layer 330, where the upper surface 300z includes at least an upper surface 330z of the capping layer 330 and may include an upper surface 310z of the gate insulation pattern 310. As shown in FIG. 4A, the capping layer 330 may isolate an upper surface 320z of the gate line 320 from an upper surface 300z of the first conductive line 300. In some example embodiments, at least one of the capping layer 330 and the gate insulation pattern 310 may at least partially isolate the gate line 320 from an exterior of the first conductive line 300.

The capping line 330 may be arranged on the gate line 320 along the first direction x in such a configuration that the gate line 320 may be isolated from surroundings and an upper surface 330z of the capping line 330 may be coplanar or substantially coplanar (e.g., coplanar within manufacturing tolerances and/or material tolerances) with the upper surface 310z of the gate insulation pattern 310. For example, the capping line 330 may comprise silicon nitride.

In some example embodiments, if and/or when the upper surface 330z of the capping line 330 may be coplanar or substantially coplanar with the upper surface 310z of the gate insulation pattern 310, an upper portion of the gate trench 190 may not sufficiently filled with (e.g., occupied by) the capping line 330. In some example embodiments, if and/or when no gate insulation pattern may be provided with the upper sidewall of the gate trench 190 over the capping line 330, the device isolation layer 200 and the junction area J of the active region A may be exposed through the upper portion of the gate trench 190.

The sealing line 400 may be arranged on (e.g., at least partially covering) the capping line 330 along the first direction x and may fill up (e.g., occupy an entirety or substantial entirety of) the upper portion 190a of the gate trench 190 in such a configuration that the capping line 330 may be isolated and protected from surroundings (e.g., an exterior of the gate trench 190) and an upper surface 400z of the sealing line 400 may be coplanar or substantially coplanar with the upper surface 200z of the device isolation layer 200 and the junction area J. For example, the sealing line 400 may comprise the same materials as the capping line 330 (e.g., the sealing line 400 and the capping line 330 may respectively comprise a common material).

Thus, both of the capping line 300 and the sealing line 400 may be arranged on the gate line 320 and the gate line 320 is protected from (e.g., "isolated from") the surroundings (e.g., an exterior of the gate trench 190) by the dual layer of the capping line 330 and the sealing line 400. In some example embodiments, the sealing line 400 and the capping line 330 may protect the gate line 320 in a subsequent etching process for forming a contact hole and may increase an aligning margin of the contact hole in the etching process. Therefore, the accuracy of the contact hole may increase while reducing the damage to the gate line 320 in the etching process for forming the contact hole.

In some example embodiments, if and/or when the gate insulation pattern 310 on the upper sidewall of the gate trench 190 (e.g., the sidewall of the upper portion 190a of the gate trench 190) may be replaced by the sealing line 400, an insulation area around the junction area J of the active region A may increase as large as the thickness of the gate insulation pattern 310.

When forming the contact hole for a direct contact DC such as a bit line contact for a BCAT in a manufacturing process, residuals of the gate insulation pattern may remain around the first junction area in the contact hole. Thus, the direct contact DC may make contact with the residuals of the gate insulation pattern around the first junction J1, which may result in an electrical connection between the direct contact DC and a buried contact BC adjacent to the DC via the gate insulation pattern. In some example embodiments, if and/or when the gate insulation pattern 310 may be sufficiently removed from the upper sidewall of the gate trench 190 and the first junction J1 may make contact with the sealing line 400 in some example embodiments, the bit line contact structure may not make contact with the residuals of the gate insulation pattern 310, thereby sufficiently limiting and/or preventing the bridge defect of the bit line contact. Accordingly, the semiconductor device 1000 may be stably operated in spite of the high integration degree and size reduction.

In some example embodiments, the capping line 330 and the sealing line 400 may comprise the same materials (e.g., one or more common materials) and, as a result, may function as a double-stepped single gate mask in the gate trench 190. The capping line 330 may make direct contact with the gate line 320 and may have a relatively smaller width in a lower portion of the gate trench 190 and the sealing line 400 may make contact with the capping line and may have a relatively greater width in an upper portion of the gate trench 190. Thus, the capping line 330 may function as narrower gate mask and the sealing line 400 may function as a wider gate mask in the gate trench 190. That is, the gate mask on the gate line 320 may be shaped into a mushroom having a stepped structure.

For example, a gate depth $D_G$, a gap distance between the upper surface of the gate line 320 and the junction area J, may be in a range of about 60 nm to about 70 nm and a sealing depth Ds, a gap distance between the upper surface of the capping line 330 and the junction area J, may be in a range of about 30 nm to about 35 nm. Thus, the capping line 330 may have a thickness of about 25 nm to about 30 nm.

In some example embodiments, if and/or when the gate insulation pattern 310 on the upper sidewall of the gate trench 190 may be removed from the substrate 100 and be covered by the sealing line 400 so as to protect the bridge defect of the bit line contact structure, some residuals of the gate insulation pattern 310 may be allowable for improving the manufacturing efficiency as long as the residuals of the gate insulation pattern 310 may have no effect on the bridge defect of the bit line contact.

Figure 4B:
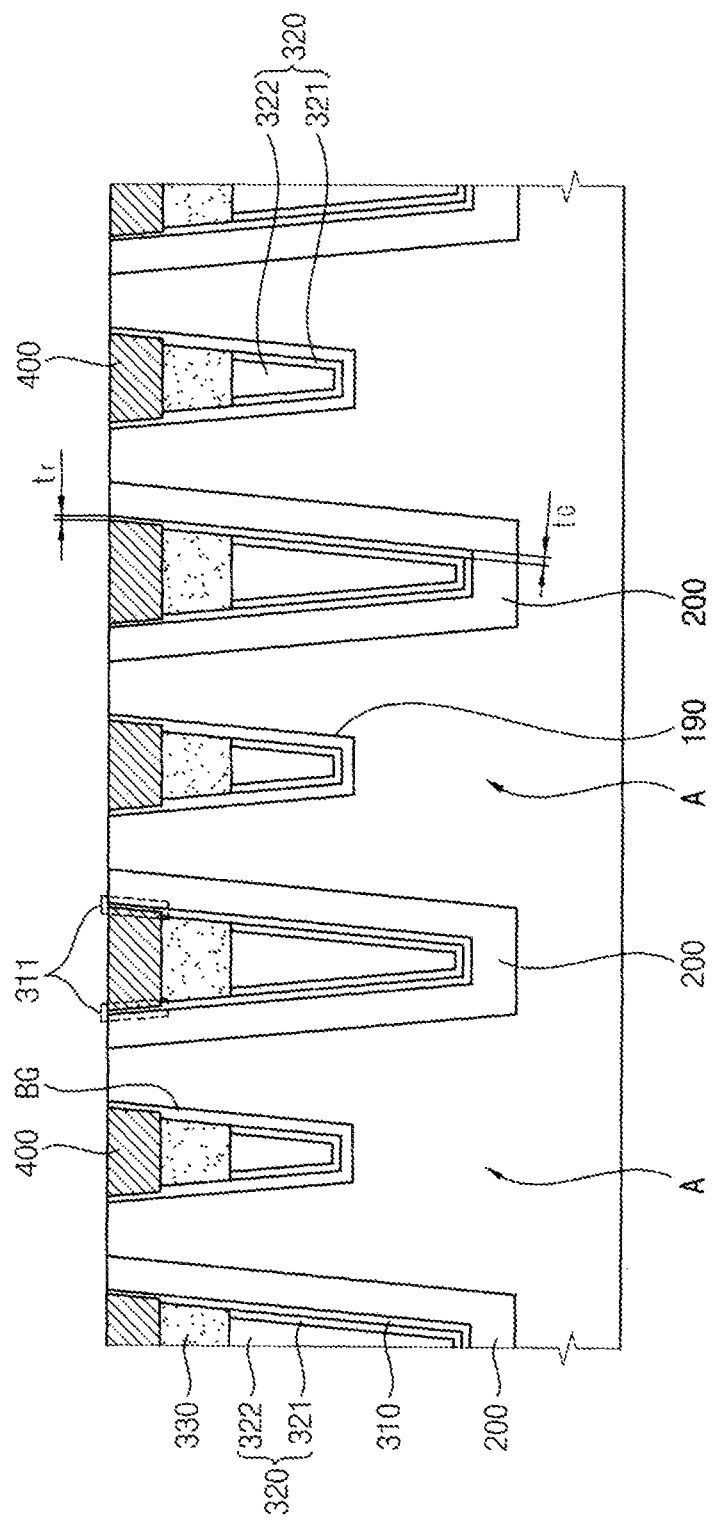
FIG. 4B is a cross-sectional view illustrating a modified example of the semiconductor device shown in FIG. 4A.

FIG. 4B is a cross-sectional view illustrating a modified example of the semiconductor device shown in FIG. 4A.

Referring to FIG. 4B, residuals 311 of the gate insulation pattern 310 may be interposed between the sealing line 400 and the upper sidewall (e.g., sidewall of the upper portion 190a) of the gate trench 190.

Some of the gate insulation pattern 310 may remain on the upper sidewall of the gate trench 190 according to the etching conditions and accuracy of the etching process for removing the gate insulation pattern 310. That is, the gate insulation pattern 310 may be partially remain on the upper sidewall of the gate trench 190 according to the etching conditions, thereby forming the residuals 311 of the gate insulation pattern 310 on the upper sidewall of the gate trench 190.

The gate insulation pattern 310 may not be fully removed from the upper sidewall of the gate trench 190 in case that the residuals 311 of the gate insulation pattern 310 may have no substantial effect on the bridge defect of the bit line contact. In such a case, the removal of the residuals 311 of the gate insulation pattern 310 may require an additional cost and time, which may reduce an overall efficiency of the semiconductor manufacturing process.

For example, if and/or when the residuals 311 of the gate insulation pattern 310 may have a thickness $t_r$ of about 1 nm to about 2 nm, the contact between the bit line contact structure and the gate insulation pattern may be sufficiently negligible and no bridge defect may be found in the semiconductor device 1000. In some example embodiments, the gate insulation pattern 310 may have a thickness $t_G$ of about 6 nm to about 8 nm. In such a case, the etching process for removing the gate insulation pattern 310 from the upper sidewall of the gate trench 190 may be performed at an etching accuracy in which a 33% of the gate insulation pattern 310 may be maximally allowed to remain on the upper sidewall of the gate trench 190.

Dopants may be implanted into the first and the second junction areas J1 and J2 by an ion implantation process, thus source junction S and drain junction D may be provided with the junction areas J1 and J2. The source and drain junctions S and D may be arranged in series along the first direction x in parallel with the first conductive line 300.

The buried gate structure BG buried in the gate trench 190 at the gate area G and the source and drain junction S and D around the buried gate structure BG may be provided as a cell transistor. Therefore, the semiconductor device 1000 may be provided as a buried channel array transistor (BCAT).

In some example embodiments, the semiconductor device 1000 may include a memory device having a pair of gate electrodes at the first and second gate areas G1 and G2, a bit line contact structure making contact with the first junction area J1 and a storage contact structure making contact with the second junction area J2. The first conductive line 300 extending in the first direction x may function as a word line and a second conductive line, described in detail hereinafter, may function as a bit line of the memory device. In some example embodiments, the semiconductor device 1000 may be designed based on a 6 $F^2$ (F: minimum feature size) layout and thus the pitch of neighboring word lines may be reduced to about 0.5 F. Therefore, the occupying area of the cell transistor of the semiconductor device 1000 may be reduce and/or minimized and the overall size of the semiconductor device 1000 may be sufficiently reduced while increasing the effective channel length.

The second conductive line and the charge storage element may be further provided on the BCAT, and the semiconductor device 1000 may be manufactured into a memory device.

Figure 5A:
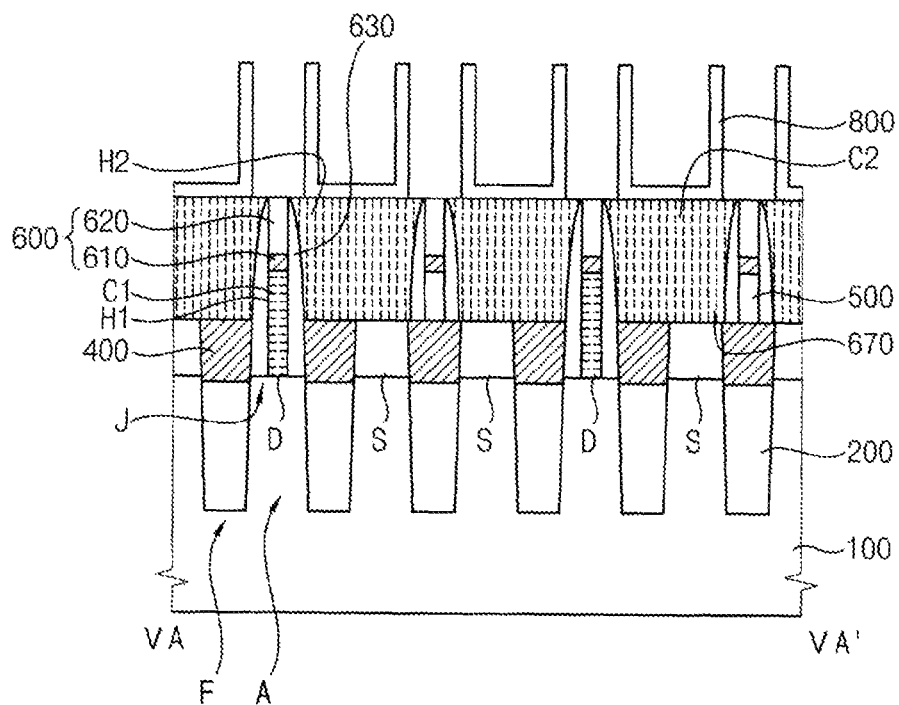
FIG. 5A is a cross-sectional view cut along the line VA-VA' of the layout shown in FIG. 2.
Figure 5B:
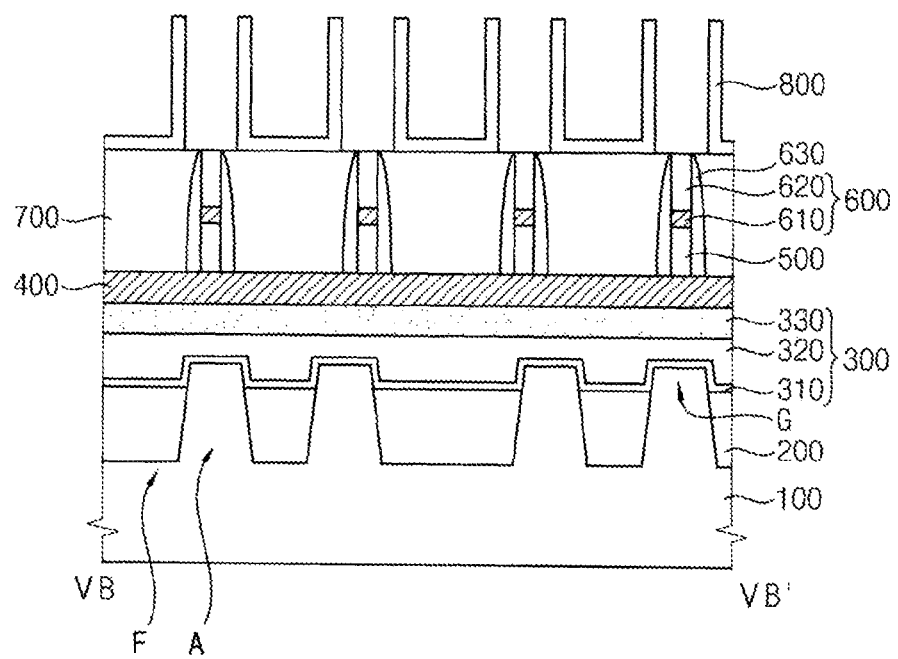
FIG. 5B is a cross-sectional view cut along the line VB-VB' of the layout shown in FIG. 2.
Figure 5C:
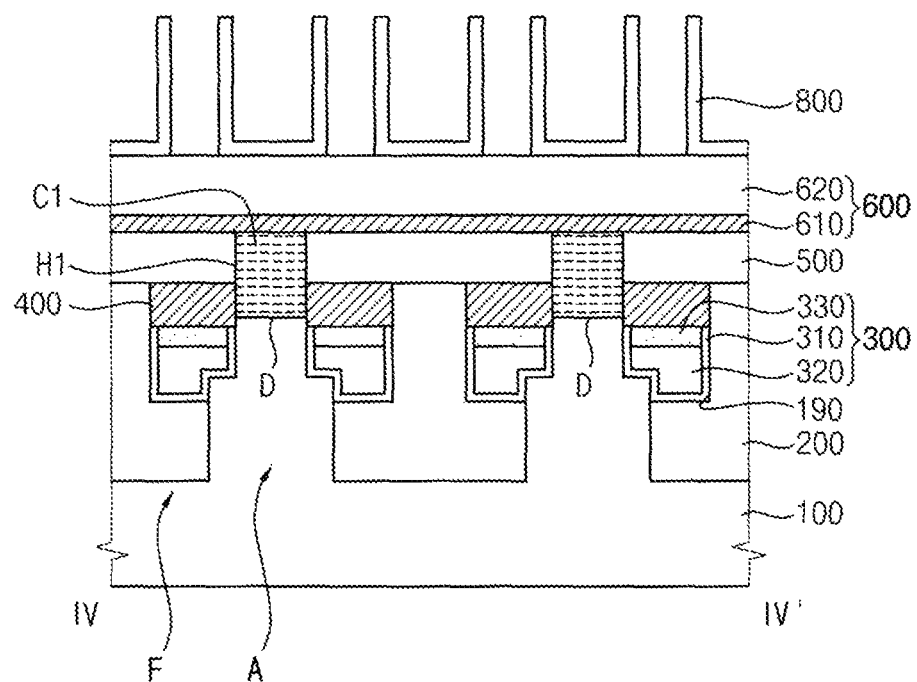
FIG. 5C is a cross-sectional view cut along the line VC-VC' of the layout shown in FIG. 2.

FIG. 5A is a cross-sectional view cut along the line VA-VA' of the layout shown in FIG. 2, and FIG. 5B is a cross-sectional view cut along the line VB-VB' of the layout shown in FIG. 2. FIG. 5C is a cross-sectional view cut along the line VC-VC' of the layout shown in FIG. 2. In FIGS. 5A to 5C, the same reference numerals denote the same elements in FIGS. 1 and 2 and thus any further detailed descriptions on the same elements will be omitted.

Referring to FIGS. 5A to 5C, a first contact structure C1, a second conductive line 600, a second contact structure C2 and a charge storage element 800 may be provided on the BACT shown in FIG. 4A. The drain junction D may be recessed to a desired (and/or alternatively, predetermined) depth in such a configuration that the drain junction D is lower than the sealing line 400 and thus a first contact hole H1 through which the drain junction D may be exposed may be defined by the sealing line 400 and the device isolation layer 200. The first contact structure C1 may include a direct contact (DC). The first contact structure C1 may be arranged at a central portion of the first contact hole H1 and may be covered with the line spacer 630 along the first direction x in the first contact hole H1. A DC included in the first contact structure C1 may be thus at least partially enclosed by the sealing line 630. The second conductive line 600 may make contact with the first contact structure C1 and may extend in the second direction y. The first contact structure C1 and the second conductive line 600 may have the same width in the first direction x. At least a portion of the second conductive line 600, including a bit line 610, may be in contact with at least a portion of the first contact structure C1, including the DC. The second contact structure may include a buried contact (BC). The second contact structure C2 may be arranged the source junction S and neighbors thereof and the charge storage element 800 may make contact with the second contact structure C2.

In some example embodiments, the drain junction D may be exposed through the first contact hole H1 and may be recessed to a desired (and/or alternatively, predetermined) depth in such a way that the drain junction D may be lower than the sealing line 400 (e.g., lower than at least a top surface of the sealing line 400). That is, the first contact hole H1 may be defined by the sealing line 400 and the device isolation pattern 200 at a lower portion thereof. The first contact structure C1 may be arranged at the central portion of the first contact hole H1 and may make contact with the drain region D. In some example embodiments, the first contact structure C1 may have the same width as the bit line 610 of the second conductive line 600 in the first direction x. Further, the sidewalls of the first contact structure C1 may be covered by the line spacer 630 in the first contact structure C1 along the first direction x. Thus, the first and the second contact structures C1 and C2 adjacent to each other may be sufficiently insulated from each other by the line spacer 630 and the sealing line 400.

The first insulation interlayer pattern 500 may include a double layer pattern having a lower pattern (not shown) comprising an oxide and an upper pattern (not shown) comprising a nitride.

A contact hole mask pattern may be formed on a first insulation interlayer (not shown) and the first insulation interlayer may be partially removed from the substrate 100 by an etching process using the contact hole mask pattern as an etching mask, thereby forming the first contact hole H1. In such a case, the contact hole mask pattern may include a drain exposure mask pattern by which the first insulation interlayer just corresponding to the drain junction D may be exposed and the rest of the first insulation interlayer may be covered. In some example embodiments, the contact hole mask pattern may include a source cover mask pattern by which the first insulation interlayer just corresponding to the source junction S may be covered and the rest of the first insulation interlayer may be exposed. Thus, when the first contact hole H1 may be formed by using the drain exposure mask pattern, the drain junction D may just be exposed through the first contact hole H1, and when the first contact hole H1 may be formed by using the source cover mask pattern, the drain junction D and neighbors thereof may be exposed through the first contact hole H1.

In some example embodiments, an upper surface of the drain junction D may be lower than the sealing line 400, so that the first contact hole H1 may be recessed to a depth of about 30 nm to about 35 nm corresponding to the sealing depth Ds of the sealing line 400.

In such a case, although the contact hole mask pattern may be misaligned with the underlying source and drain junctions S and D, the first contact structure C1 may be sufficiently removed from a peripheral portion of the first contact hole H1 in a GBL etching process since no gate insulation pattern 310 may be provided at an upper portion of the gate trench 190. Thus, the first contact structure C1 may just remain at a central portion of the first contact hole H1 under the bit line 610 and may be sufficiently separated from a second contact structure C2 adjacent to the first contact structure C1 by the line spacer 630 and the sealing line 400 in the first direction x. Accordingly, the bridge defect of the first contact structure C1 may be sufficiently limited and/or prevented in the semiconductor device 1000.

The first contact structure C1 may comprise conductive materials such as polysilicon and a low-resistive metal. The drain junction D may make contact with the first contact structure C1 and a bit line 610 may make contact with the first contact structure C1. In some example embodiments, the bit line 610 and the first contact structure C1 may have the same width and the bit line 610 may be substantially coplanar with a top surface of the source junction S since the first contact structure C1 may have the same height as the drain junction S may be recessed in the first contact hole H1, so that the bit line 610 may be provided as a gate bit line (GBL). The bit line 610 may extend in the second direction y and a bit line mask 620 may be arranged on the bit line 610, so the bit line 610 may be protected from surroundings by the bit line mask 620. The bit line 610 and the bit line mask 620 may constitute the second conductive line 600. The height of the second conductive line 600 may be controlled by regulating the height of the bit line mask 620.

In some example embodiments, the second conductive line 600 may function as a word line of the memory device and the first conductive line 300 may function as a bit line of the memory device.

Various modifications to the first contact structure C1 and the bit line 610 may be allowable in view of the performance improvement of the memory device. For example, the first contact structure C1 may be formed into a reverse trapezoidal shape so as to enlarge the contact area with the bit line 610 and to reduce and/or minimize the leaning defect caused by a high aspect ratio of the first contact hole H1.

In some example embodiments, when the drain junction D may be recessed to a desired (and/or alternatively, pre-determined) drain recess in such a way that the upper surface of the drain junction D may be lower than upper surfaces of the device isolation layer 200 and the sealing line 400, the bit line 610 may also be lowered as much as the drain recess and as a result, an overall size of the memory device may also be reduced. Thus, the bit line 610 may be arranged at the same level as a peripheral gate electrode of the memory device as the GBL.

A line spacer 630 may be arranged on both sidewalls of the second conductive line 600 in the second direction y. In some example embodiments, the line spacer 630 may fill in the peripheral portion of the first contact hole H1 between the sealing line and the first contact structure C1, so that the first contact structure C1 on the drain junction D and the neighboring second contact structure C2 on the source junction S may be separated from each other by the line spacer 630 and the sealing line 400. In some example embodiments, if and/or when no residuals of the conductive materials of the first contact structure C1 may remain in the first contact hole H1 in the GBL etching process, the bridge defect between the first and the second contact structures C1 and C2 may be limited and/or prevented in the semiconductor device 1000.

The gap space between the neighboring second conductive lines 600 may be filled with a second insulation interlayer pattern 700. The second contact hole H2 may be arranged through the second insulation interlayer pattern 700 and the source junction S may be exposed through the second contact hole H2. The second contact structure C2 may be arranged in the second contact hole H2, so the source junction S may make contact with the second contact structure C2 in the second contact hole H2. In some example embodiments, the source junction S and the device isolation layer 200/sealing line 400 around the source junction S may be exposed through the second contact hole H2, thus the second contact structure C2 may make contact with the source junction S and may be defined by at least one of the device isolation layer 200 and the sealing line 400 around the source region S. The charge storage element 800 may be arranged on the second insulation interlayer pattern in such a way that the second contact structure C2 may make contact with the charge storage element 800. Therefore, the source junction S may be electrically connected to the charge storage element 800 via the second contact structure C2. In some example embodiments, the second contact structure C2 may include a buried contact BC that may be inserted into second junction area J2 and the charge storage element 800 may include a capacitor making contact with the BC included in the second contact structure.

Accordingly, the memory device may include a BCAT having a buried gate structure BG on the gate area G and first and the drain and source junctions D making contact with the first contact structure C1 and source junctions S making contact with the second contact structure C2, the second conductive line 600 making contact with the first contact structure C1 as a GBL and the charge storage element 800 making contact with the second contact structure C2.

According to the semiconductor device 1000 of the present inventive concepts, the gate insulation pattern may be removed from an upper sidewall of the gate trench 190 and the upper portion of the gate trench 190 may be filled up with the sealing line 400 such that the gate insulation pattern and the capping layer may be covered with the sealing line 400. Thus, the gate insulation pattern 310 enclosing the junction area J along the gate trench 190 may be removed at the upper portion of the gate trench 190 and an insulation area around the junction area J of the active region A may increase as large as the thickness of the gate insulation pattern 310.

Thus, although the contact hole mask pattern may be misaligned with the underlying drain junction D of active region A, no residual gate insulation pattern may be remain in an etching process for forming the first contact hole H1, to thereby limit and/or prevent a width increase of the first contact hole H1 caused by the removal of the residuals of the gate insulation pattern in a subsequent cleaning process. Thus, the sidewall of the first contact hole H1 may be formed to be a flat surface without a stepped portion between the insulation interlayer pattern and the underlying the sealing line. As a result, no residual conductive materials may remain at the peripheral portion of the first contact hole H1 in a subsequent GBL etching process, thereby limiting and/or preventing the bridge defect between the first contact structure C1 and the second contact structure C2 via the residuals of the conductive materials in the first contact hole H1.

In some example embodiments, both of the capping line 330 and the sealing line 400 may be stacked on the gate line 320 in the gate trench 190, so the gate line 320 may be sufficiently protected in a subsequent etching process for forming the first and the second contact structures C1 and C2. In some example embodiments, if and/or when the gate insulation pattern 310 may be sufficiently removed from the upper sidewall of the gate trench 190 and the first junction J1 may make contact with the sealing line 400 in some example embodiments, the first contact structure C1 may not make contact with the residuals of the gate insulation pattern 310, thereby sufficiently limiting and/or preventing the bridge defect of the first contact structure in the first contact hole H1. Accordingly, the semiconductor device 1000 may be stably operated in spite of the high integration degree and size reduction.

Hereinafter, the manufacturing process for the memory devices having a plurality of buried channel array transistors each of which may include substantially the same structures as the semiconductor devices shown in FIGS. 1 to 4B based on the layout of FIG. 2. In FIGS. 6A to 17C, the alphabetic letter A in each figure number denotes a cross-sectional view cut along the line II-II' of the layout shown in FIG. 2 and the alphabetic letter B in each figure number denotes a cross-sectional view cut along the line III-III' of the layout shown in FIG. 2. The alphabetic letter C in each figure number denotes a cross-sectional view cut along the line IV-IV' of the layout shown in FIG. 2.

FIGS. 6A to 17C are cross-sectional views illustrating process steps for a method of manufacturing memory devices including the semiconductor device shown in FIG. 1 in accordance with some example embodiments of the present inventive concepts.

Figure 6A:
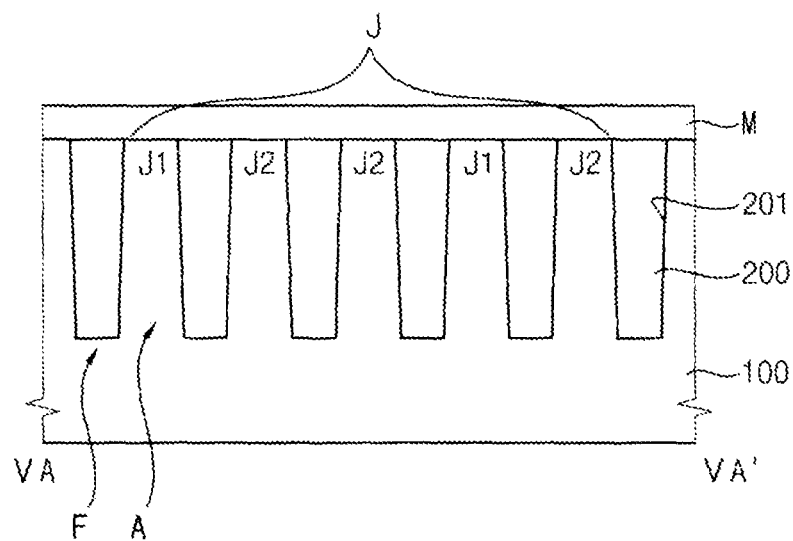
FIGS. 6A to 6C are cross-sectional views illustrating a process operation for a method of manufacturing memory devices including the semiconductor device shown in FIG. 1 in accordance with some example embodiments of the present inventive concepts.
Figure 6B:
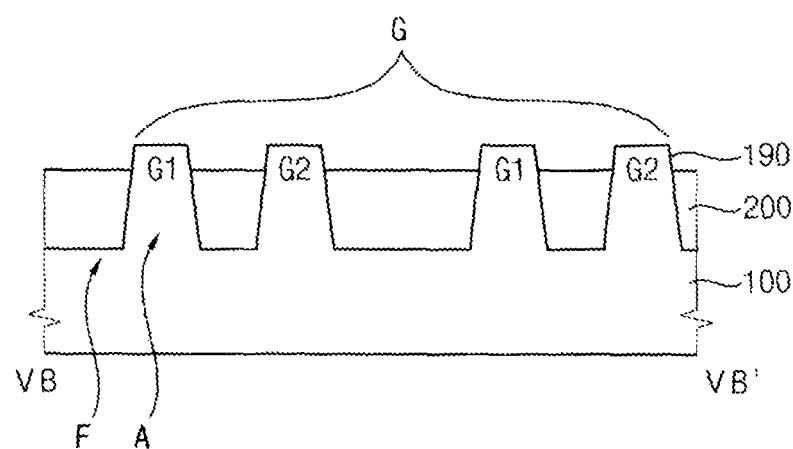
Figure 6C:
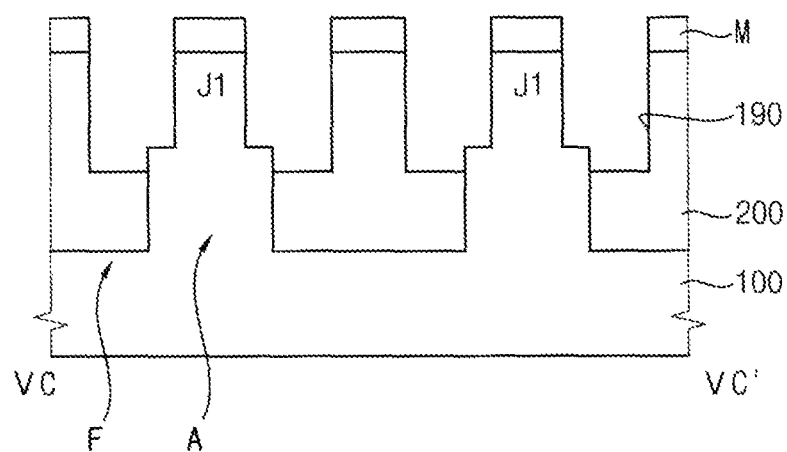

Referring to FIGS. 6A to 6C, the gate trench 190 may be formed on the substrate 100 on which the active region A may be defined by the device isolation layer 200 along the first direction x in such a way that the active region A and the gate trench 190 may cross each other. Thus, the active region A of the substrate 100 may be separated into one or more gate areas G that may be lower than the top-most surface of the substrate 100 and one or more junction areas J that may be provided on the top-most surface of the substrate 100.

For example, a device isolation trench 201 may be formed on the substrate 100 and insulation materials may be filled up into the device isolation trench, thereby forming the device isolation layer 200 defining the active region A.

The substrate 100 may include a semiconductor substrate such as a silicon substrate, a silicon-germanium substrate and a silicon-on-insulator (SOI) substrate and may be classified into the active region A on which conductive structures may be located and the field region F defining the active region A. The device isolation layer 200 may be provided with the field region F, so the neighboring conductive structures on the adjacent active region A may be electrically isolated from each other by the device isolation layer 200 around the active region A.

In some example embodiments, the device isolation layer 200 may be provided on one or more field regions F of the substrate 100 by a device isolation process such as a shallow-trench isolation (STI) process. The device isolation trench may be formed on the substrate 100, for example by a plasma etching process, and may be filled up with the insulation materials such as BPSG, USG, HDP oxides, and nitrides.

In some example embodiments, the active region A may be slanted (e.g., diagonal) with respect to the first or the second directions x and y and shaped into a bar having a length much greater than a width. The neighboring slanted active regions A may be separated from each other by the device isolation layer 200. Thus, a plurality of the slanted active regions A may be arranged on the device isolation layer 200 just like isolated islands.

In some example embodiments, the gate trenches 190 may be formed into a line shape on the substrate 100 along the first direction x with the gate trenches 190 being spaced apart by the same distance in the second direction y. For example, a line-shaped mask pattern M may be formed on the substrate 100 including the device isolation layer 200 in the first direction x and then an etching process may be performed to the substrate 100 using the mask pattern M as an etching mask. Thus, the substrate 100 of the active region A and the device isolation layer 200 may be recessed to a depth along the first direction x, thereby forming the line-shaped gate trench 190 in the first direction x.

In some example embodiments, if and/or when the etching rate of the device isolation layer 200 may be higher than that of the substrate 100 of the active region A, an upper surface of the device isolation layer 200 may be lower than that of the active region A at the bottom of the gate trench 190. Thus, the bottom of the gate trench 190 may be repeatedly protruded at every active region A along the first direction x.

In some example embodiments, if and/or when the active region A may be slanted with respect to the first direction x, the active region A and the device isolation layer 200 around the active region A may be alternately recessed to a depth in the first direction x, and as a result, the active region A may be separated into the gate area G that may be positioned at the bottom of the gate trench 190 and the junction area J corresponding to the top surface of the substrate 100 around the gate trench 190 without being removed.

In some example embodiments, a pair of the gate trenches 190 may cross a single active region A that may be shaped into a bar and slanted with respect to the gate trench 190. Therefore, the gate area G may include first and second gate areas G1 and G2 and the junction area J may include a first junction area J1 that may be positioned at a central portion of the bar-shaped active region A and a second junction area J2 that may be positioned at both end portions of the bar-shaped active region A.

Figure 7A:
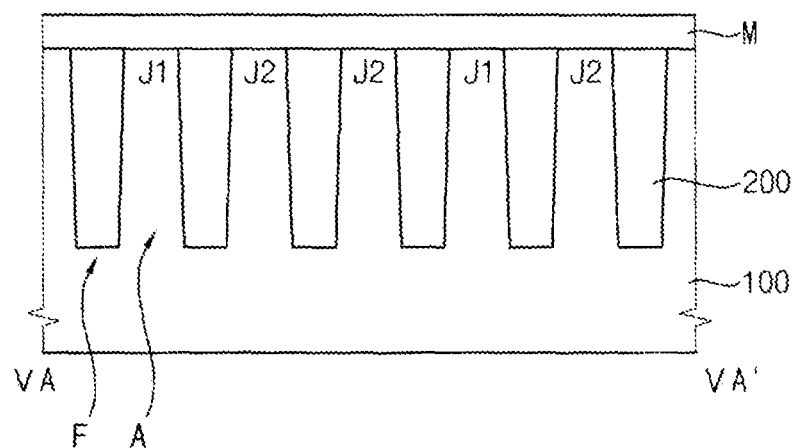
FIGS. 7A to 7C are cross-sectional views illustrating a process operation for a method of manufacturing memory devices including the semiconductor device shown in FIG. 1 in accordance with some example embodiments of the present inventive concepts.
Figure 7B:
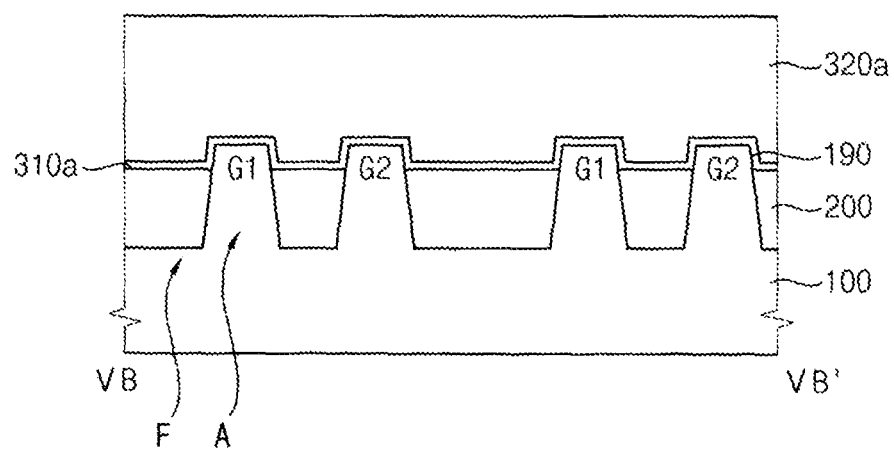
Figure 7C:
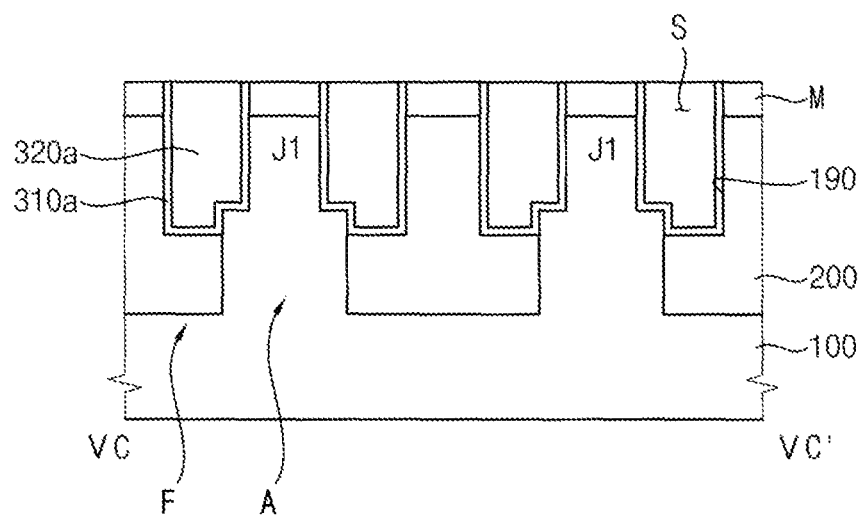

Referring to FIGS. 7A to 7C, a preliminary gate insulation pattern 310a and a gate conductive pattern 320a covering the preliminary gate insulation pattern 310a may be formed on the substrate 100 in such a way that the gate trench 190 may be filled up with the preliminary gate insulation pattern 310a and the gate conductive pattern 320a (e.g., the preliminary gate insulation pattern 310a and the gate conductive pattern 320a occupy a substantial entirety of the gate trench 190, wherein a substantial entirety is an entirety within manufacturing tolerances and/or material tolerances).

For example, a preliminary gate insulation layer (not shown) may be formed on the substrate 100 along a surface profile of the gate trench 190 by a CVD process or a thermal oxidation process, so that the sidewall and the bottom of the gate trench 190 as well as the sidewall and top surfaces of the mask pattern M may be covered with the preliminary gate insulation layer. Then, a gate conductive layer (not shown) may be formed on the preliminary gate insulation layer to a sufficient thickness to fill up the gate trench 190 and a gap space S between neighboring lines of the mask pattern M by a physical vapor deposition (PVD) process or a sputter process. The gap space S and the gate trench may be communicated with each other.

Then, the gate conductive layer and the preliminary gate insulation layer may be partially removed from the substrate 100 by a planarization process until a top surface of the mask pattern M may be exposed, so the preliminary gate insulation layer and the gate conductive layer may remain just in the gate trench 190 and the gap space S, thereby forming the preliminary gate insulation pattern 310a and a gate conductive pattern 320a in the gate trench 190 and the gap space S.

Figure 8A:
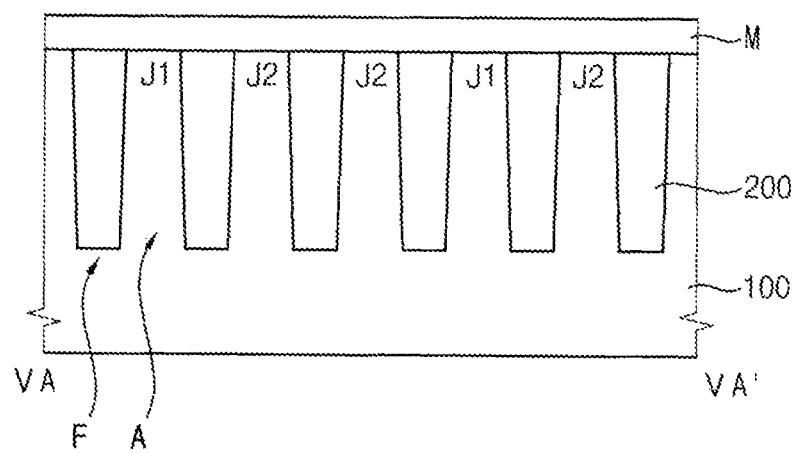
FIGS. 8A to 8C are cross-sectional views illustrating a process operation for a method of manufacturing memory devices including the semiconductor device shown in FIG. 1 in accordance with some example embodiments of the present inventive concepts.
Figure 8B:
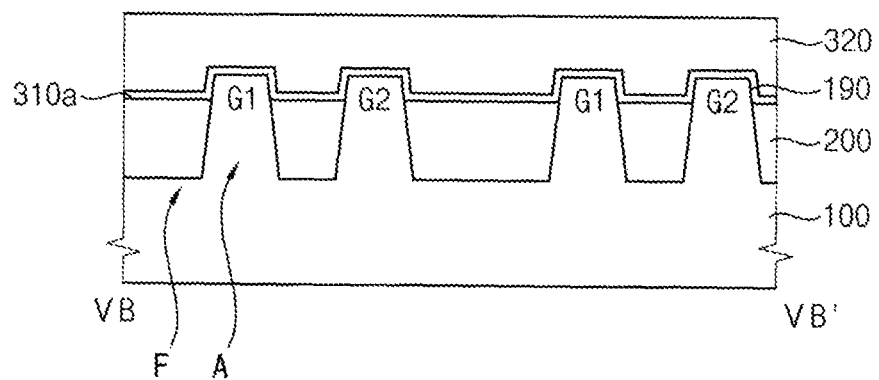
Figure 8C:
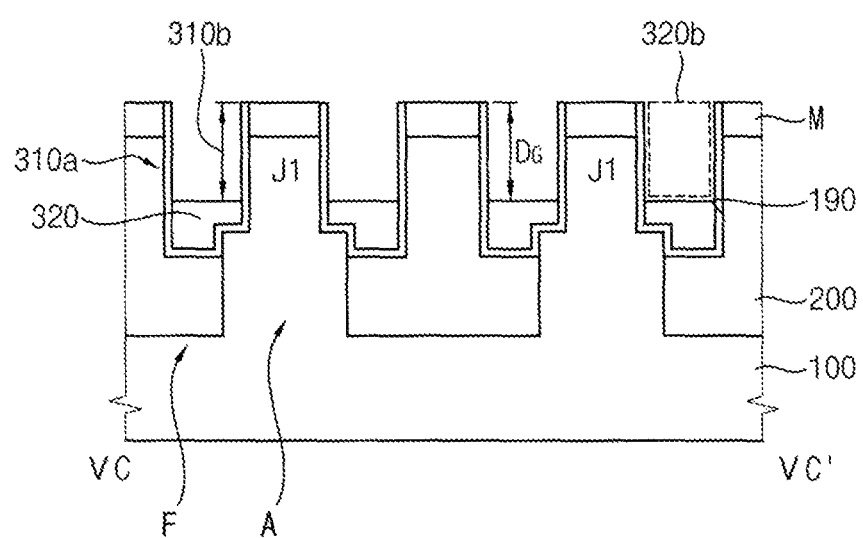

Referring to FIGS. 8A to 8C, an upper portion 320b of the gate conductive pattern 320a may be removed to a gate depth $D_G$ from the substrate 100, thereby forming the gate line 320 in a lower portion of the gate trench 190. In such case, an upper portion 310b of the preliminary gate insulation pattern 310a may be exposed to the upper portion of the gate trench 190.

For example, an etch-back process may be performed to the gate conductive pattern 320a to a desired (and/or alternatively, predetermined) depth $D_G$, thus an upper portion of the gate conductive pattern 320a may be further removed from the substrate 100 and a lower portion of the gate conductive pattern 320a may remain in a lower portion of the gate trench 190. Therefore, the bottom and sidewall of the gate trench 190 may be covered with the preliminary gate insulation pattern 310a and the gate conductive pattern 320 may be transformed to the gate line 320 filling up the lower portion of the gate trench 190 and extending in the first direction x. In such a case, an upper surface of the gate line 320 may be lower than top surfaces of the preliminary gate insulation pattern 310a and the junction area J of the active region A of the substrate 100.

Figure 9A:
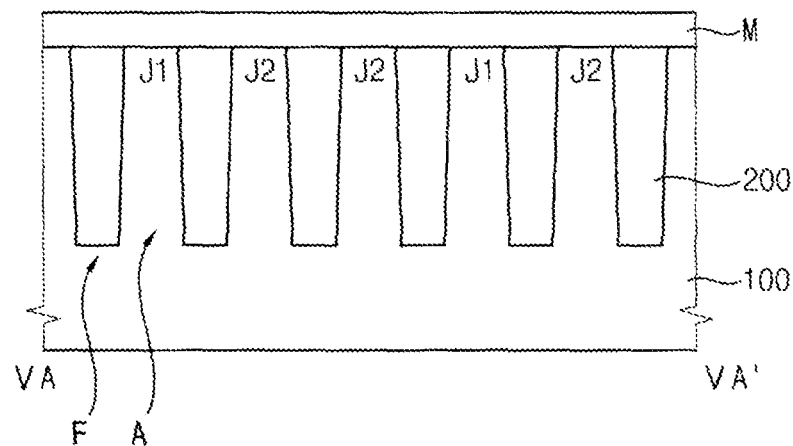
FIGS. 9A to 9C are cross-sectional views illustrating a process operation for a method of manufacturing memory devices including the semiconductor device shown in FIG. 1 in accordance with some example embodiments of the present inventive concepts.
Figure 9B:
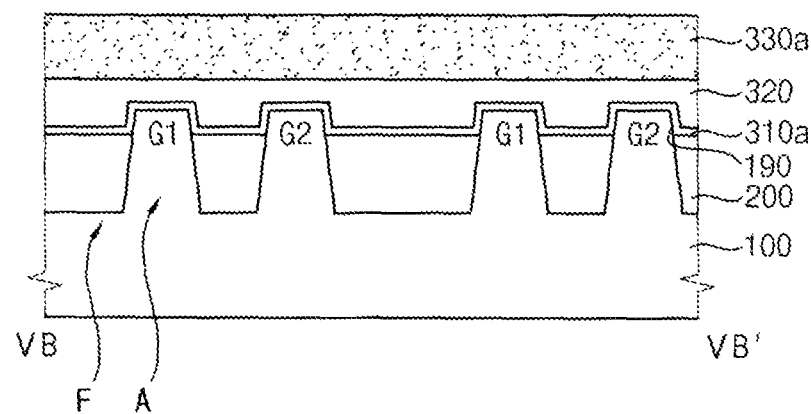
Figure 9C:
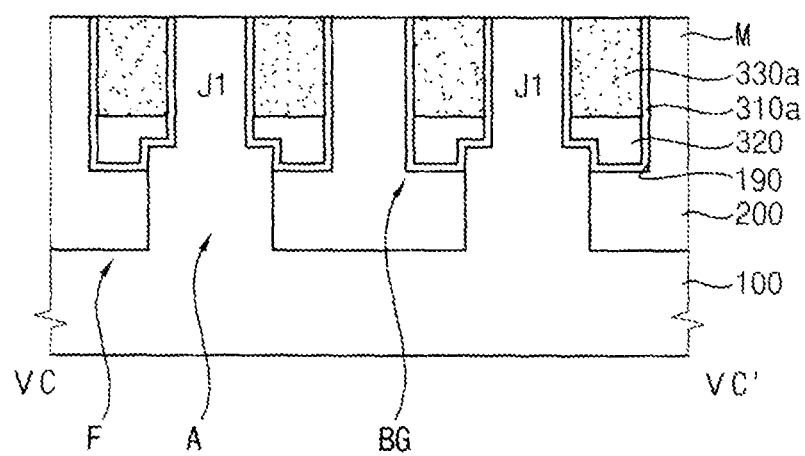

Referring to FIGS. 9A to 9C, a capping pattern 330a may be formed on the gate line 320 in such a way that the gate trench 190 defined by the preliminary gate insulation pattern and the gate line may be filled up with the capping pattern 330a.

For example, a capping layer (not shown) may be formed on the substrate 100 to a sufficient thickness to fill up the gap space S and the gate trench 190 that may be defined by the preliminary gate insulation pattern 310a and the gate line 320. Then, the capping layer may be planarized until the top surface of the mask pattern M is exposed, thereby forming a capping pattern 330a enclosed, at sidewalls, by the preliminary gate insulation pattern 310a and, at a bottom surface, by the gate line 320 in the gate trench 190. The capping pattern may also extend in the first direction x.

In some example embodiments, the preliminary gate insulation pattern 310a may comprise silicon oxide and the gate line 320 may comprise conductive materials such as polysilicon and low resistive metal or metallic compounds. In some example embodiments, the gate line 320 may include a barrier layer 321 comprising tungsten nitride (WN) or titanium nitride (TiN) and a conductive layer 322 comprising tungsten (W) and titanium (Ti). The capping pattern 330a may comprise silicon nitride having good insulation and etch-resistance characteristics.

Figure 10A:
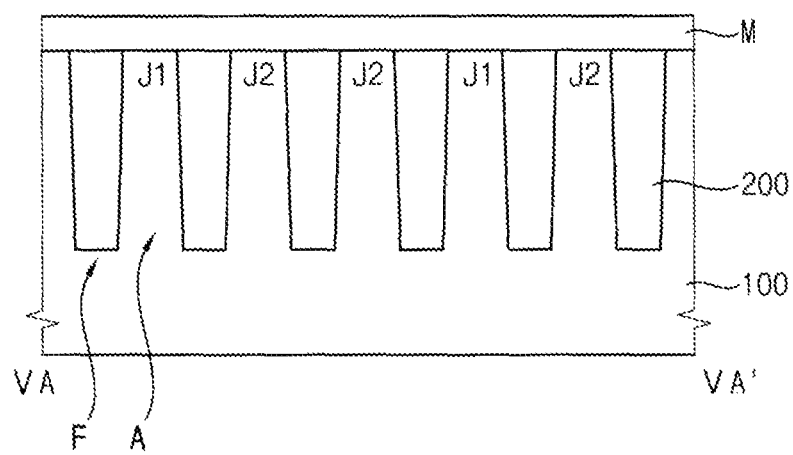
FIGS. 10A to 10C are cross-sectional views illustrating a process operation for a method of manufacturing memory devices including the semiconductor device shown in FIG. 1 in accordance with some example embodiments of the present inventive concepts.
Figure 10B:
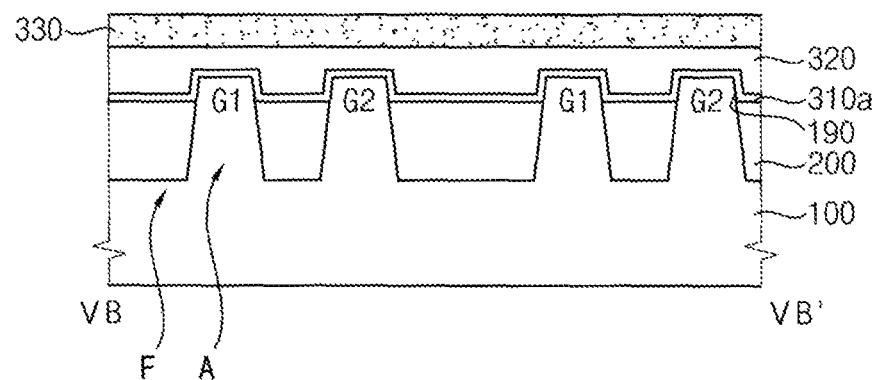
Figure 10C:
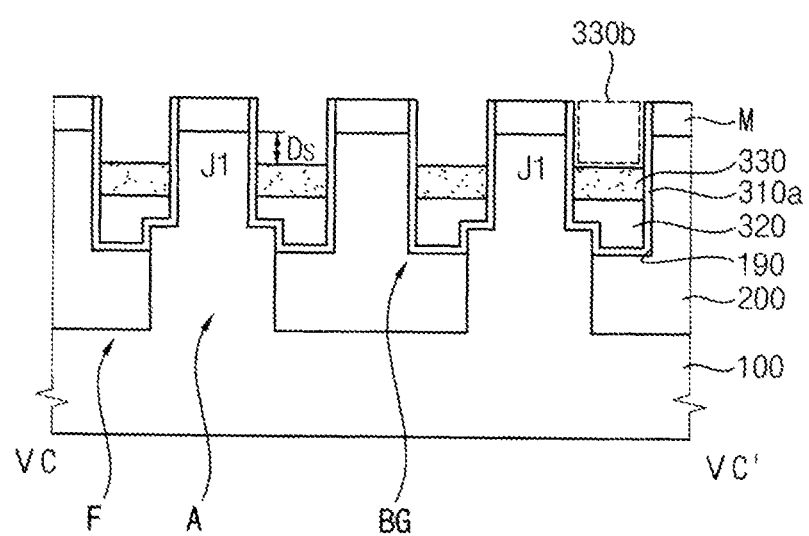

Referring to FIGS. 10A to 10C, the capping pattern 330a may be partially removed from the gate trench 190 (e.g., an upper portion 330b of the capping pattern 330a may be removed) and the gap space S in such a way that residuals of the capping pattern 330a may be lower than the first and the second junction areas J1 and J2, thereby forming the capping line 330 on the gate line 320 in the gate trench 190.

For example, an etch-back process may be performed to the capping pattern 330a using the mask pattern M as an etching mask to a sealing depth Ds in such a way that the remaining capping pattern 330a in the gate trench 190 may be lower than the top-most surface of the substrate 100 of the junction area J. Thus, the capping pattern 330a may be formed into the capping line 330 covering the gate line 320 and extending in the first direction x in the gate trench 190 and the preliminary gate insulation pattern 310a may be exposed toward an upper portion of the gate trench 190.

In a subsequent process, the sealing line 400 may be formed on the capping line 330 and the upper portion of the gate trench 190 corresponding to the sealing depth Ds, so that the sealing depth Ds of the capping pattern 330a may be varied according to a height of the sealing line 400.

In some example embodiments, the capping pattern 330a may be recessed to the sealing depth Ds by a wet etching having an etching selectivity with respect to the preliminary gate insulation pattern 310a.

Figure 11A:
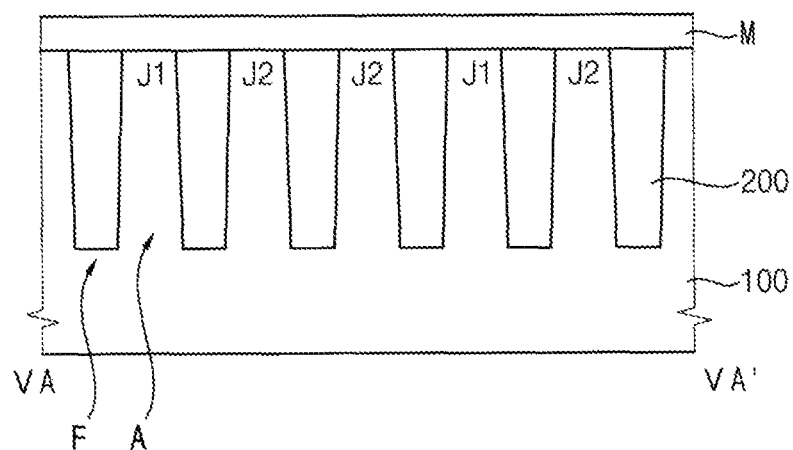
FIGS. 11A to 11C are cross-sectional views illustrating a process operation for a method of manufacturing memory devices including the semiconductor device shown in FIG. 1 in accordance with some example embodiments of the present inventive concepts.
Figure 11B:
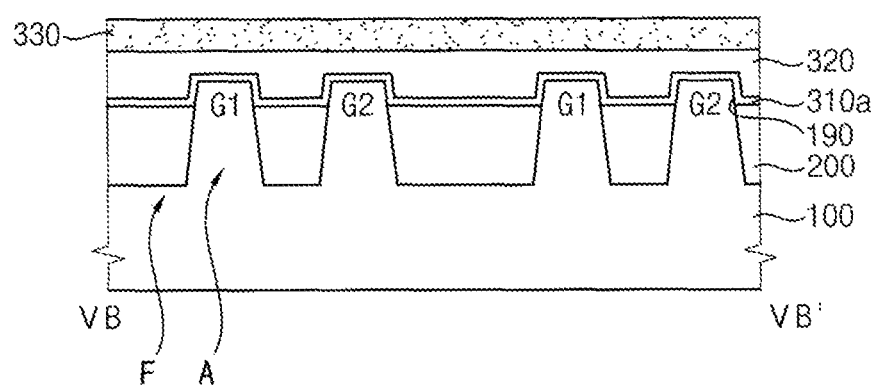
Figure 11C:
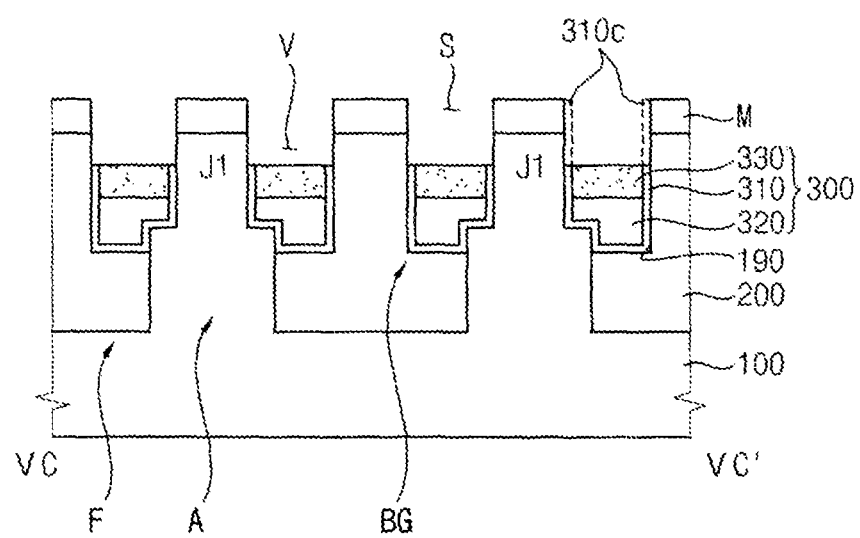

Referring to FIGS. 11A to 11C, the preliminary gate insulation pattern 310a may be partially removed from the sidewall of the gate trench 190 (e.g., an upper portion 310c of the preliminary gate insulation pattern 310a that is exposed to the gate trench from the capping pattern 330 and gate line 320 may be removed), to thereby form the gate insulation pattern in such a way that an upper surface 310c of the gate insulation pattern 310 may be coplanar or substantially coplanar with an upper surface 330d of the capping line 330. Thus, the gate insulation pattern 310 may be interposed between a lower sidewall of the gate trench 190 and the gate line 320 and the capping line 330.

For example, a wet etching process may be performed to the preliminary gate insulation pattern 310a by an etchant having etching selectivity with respect to the mask pattern M and the capping line 330 until residuals 311 of the preliminary gate insulation pattern 310a in the gate trench 190 may be coplanar or substantially coplanar with the capping line 330.

Therefore, an upper portion V of the gate trench 190 and the gap space S between the neighboring lines of the mask pattern M may be opened again and the gate line 320 and the capping line 330 enclosed by the gate insulation pattern 310 may be formed into the first conductive line 300 in a lower portion of the gate trench 190. A plurality of the buried gate structures BG may be arranged at every gate areas G along the first direction x.

Figure 12A:
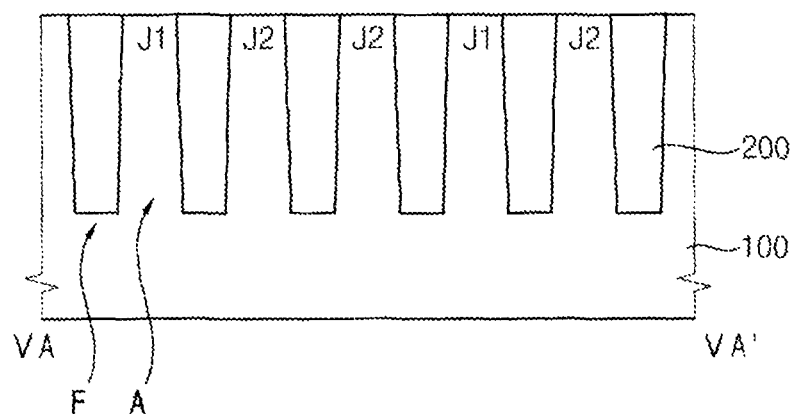
FIGS. 12A to 12C are cross-sectional views illustrating a process operation for a method of manufacturing memory devices including the semiconductor device shown in FIG. 1 in accordance with some example embodiments of the present inventive concepts.
Figure 12B:
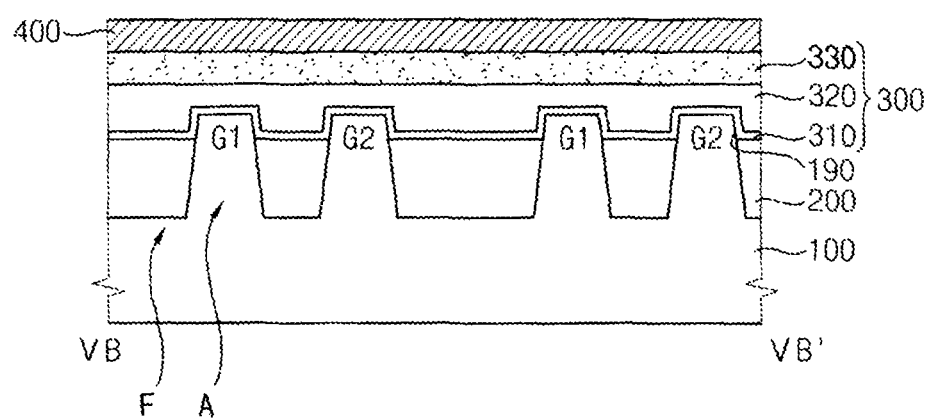
Figure 12C:
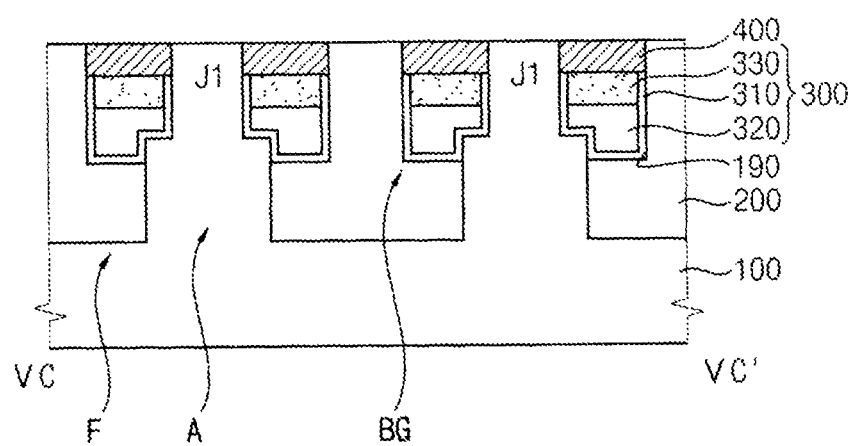

Referring to FIGS. 12A to 12C, insulation materials may be filled into the upper portion V of the gate trench 190, thereby forming the sealing line 400 on the capping line 330.

For example, a sealing layer (not shown) may be formed on the mask pattern M to a sufficient thickness to fill up the upper portion V of the gate trench 190 and the gap space S, and may be planarized until an upper surface of the junction area J may be exposed. Thus, the mask pattern M may be removed from the substrate in the planarization process. In some example embodiments, the sealing layer may be planarized until the upper surface of the mask pattern M may be exposed and the sealing layer may be etched off by an etch-back process together with the mask pattern M until the upper surface of the junction area J may be exposed.

Therefore, the sealing layer may just remain in the upper portion V of the gate trench 190 and may be separated by the gate trench 190, thereby forming the sealing line 400 extending in the first direction x. In some example embodiments, the sealing line 400 may cover the gate insulation pattern 310 as well as the capping line 330, so that the sealing line 400 may have a thickness greater than that of the capping line as much as the thickness of the gate insulation pattern 310.

The sealing line 400 may comprise the same insulation materials (e.g., a common insulation material) as the capping line 330 or porous materials of which the porosity may be greater than that of the capping line 330. For example, the sealing line 400 may include silicon nitride (SiN) or silicon boron nitride (SiBN).

In a subsequent process, the drain junction D may be recessed to a depth in such a way that recessed drain junction D may have a top surface greater than or equal to a top surface of the capping line 330, so that the first contact hole H1 may be defined by the sealing line 400 and the device isolation layer 200. That is, no gate insulation pattern 310 may be arranged around the first contact hole H1.

Figure 13A:
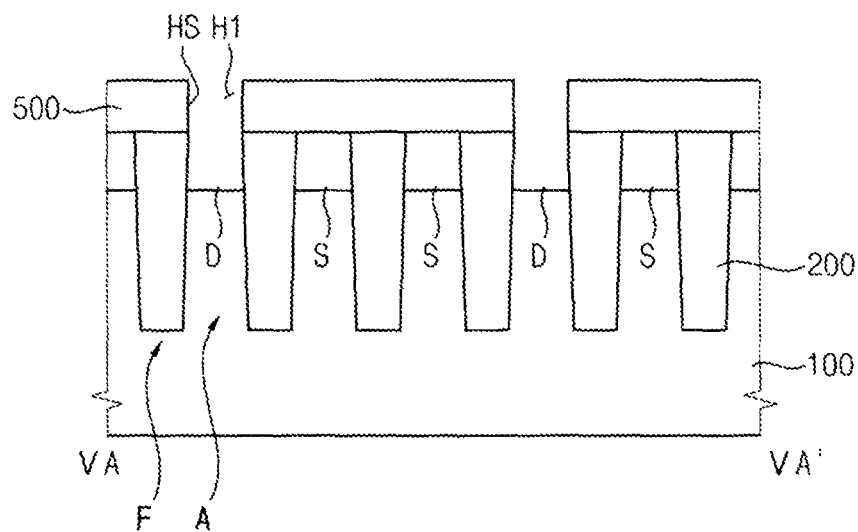
FIGS. 13A to 13C are cross-sectional views illustrating a process operation for a method of manufacturing memory devices including the semiconductor device shown in FIG. 1 in accordance with some example embodiments of the present inventive concepts.
Figure 13B:
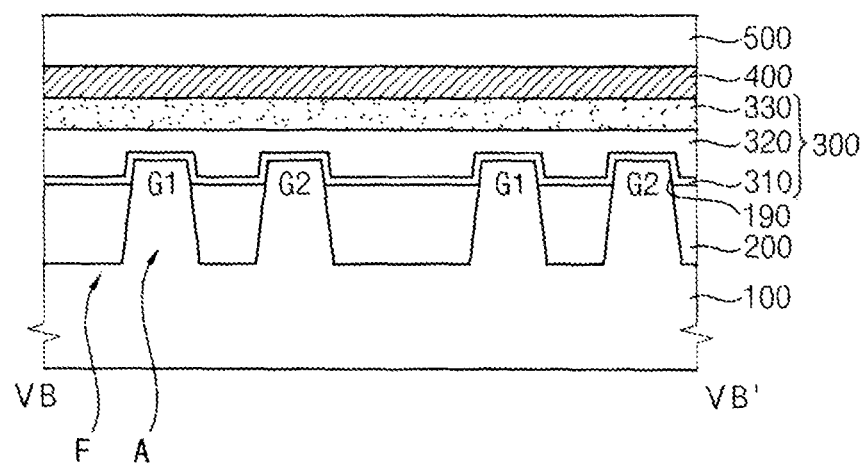
Figure 13C:
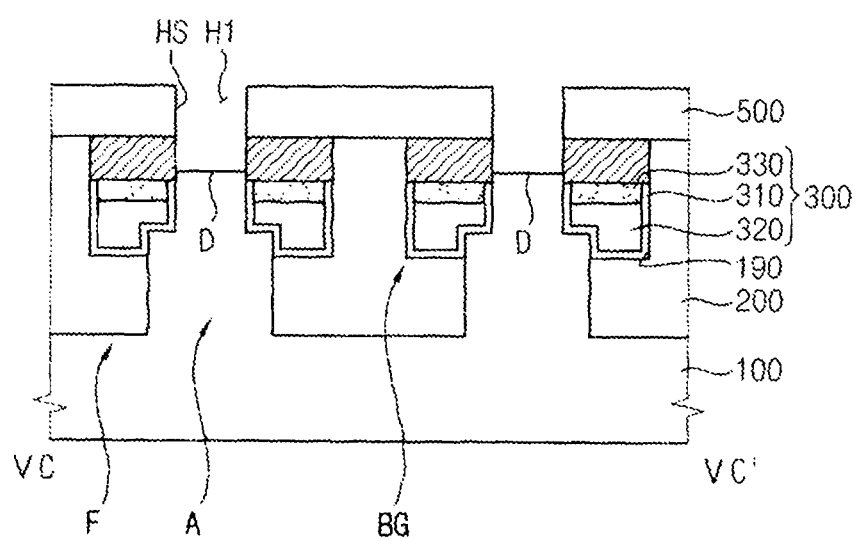

Referring to FIGS. 13A to 13C, an upper portion of the drain junction D may be removed from the substrate 100, thereby reducing a height of the drain junction D and forming a first contact hole H1 defined by the sealing line 400 and the device isolation layer 200. The reduced drain junction D may be exposed through the first contact hole H1.

A plurality of dopants may be implanted onto the junction area J by an ion implantation process using the device isolation layer 200 and the sealing layer 400 as an ion implantation mask, thereby forming the source and drain junctions S and D. The buried gate structure BG and a pair of the source and drain junctions S and D around the buried gate structure BG in the active region A may be formed into a buried channel array transistor BCAT. Thus, the BCAT may have substantially the same structure as the semiconductor device 1000 shown in FIG. 1 in some example embodiments.

Thus, a plurality of the sealing lines 400, which may arranged in the second direction y at the same intervals, may extend in the first direction x and the source and drain junctions S and D may be arranged in a line between the neighboring sealing layers 400.

In some example embodiments, if and/or when a pair of the first conductive lines 300 may be arranged in a single active region A, the drain junction D may be formed at a central portion of the active region A and the source junction S may be formed at both end portions of the active region A.

Then, a first insulation interlayer (not shown) may be formed on the substrate 100 having the source and drain junctions S and D and may be partially removed from the substrate 100, thereby forming a first contact hole through which the drain junction D may be exposed. In some example embodiments, the device isolation layer 200 and the sealing line 400 around the drain junction D may be further removed from the substrate 100 and the first contact hole H1 may be enlarged around the drain junction D, which may improve the process margin of the etching process for forming the first contact hole H1.

For example, the first insulation interlayer may be uniformly formed on the substrate 100 by a CVD process, and a contact hole mask pattern may be formed on the first insulation interlayer. The first insulation interlayer may be partially removed by an etching process using the contact hole mask pattern as an etching mask, thereby forming the first insulation interlayer pattern 500 having the first contact hole H1.

In some example embodiments, if and/or when the first contact hole H1 may be defined by the sealing line 400 and the device isolation layer 200, no gate insulation pattern 310 may remain around the first contact hole H1 although the contact hole mask pattern may be misaligned with the underlying drain junction D. In a subsequent cleaning process, the sealing line 400 and the first insulation interlayer pattern 500 may have the substantially removal rate with respect to a cleaning solution, the contact hole H1 may be sufficiently limited and/or prevented from being widened under the first insulation interlayer 500 in the cleaning process. That is, the hole sidewall HS of the first contact hole H1 may be uniform and continuous without any stepped portions along the sealing line 400 to the first insulation interlayer pattern 500.

Figure 18A:
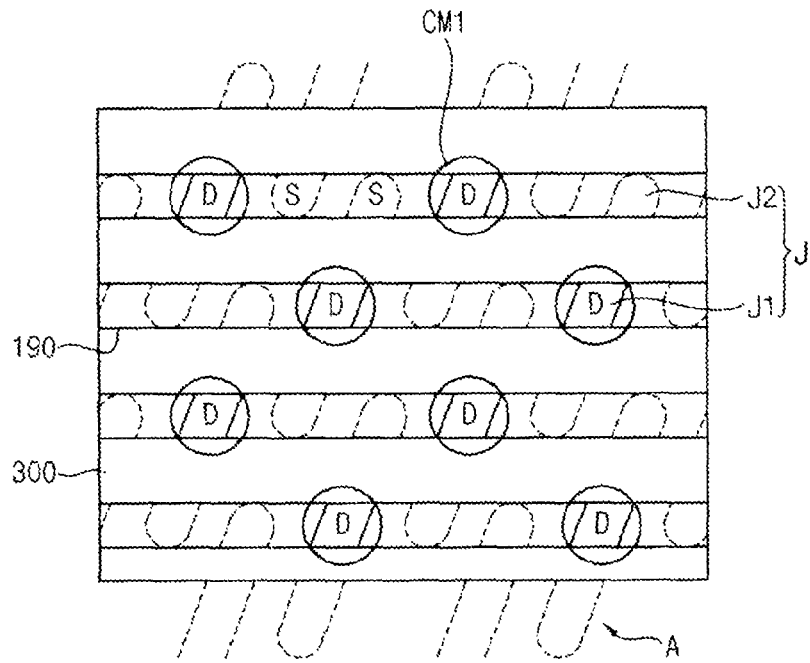
FIG. 18A and FIG. 18B are plan views illustrating the contact hole mask pattern on the first insulation interlayer pattern shown in FIGS. 13A to 13C.
Figure 18B:
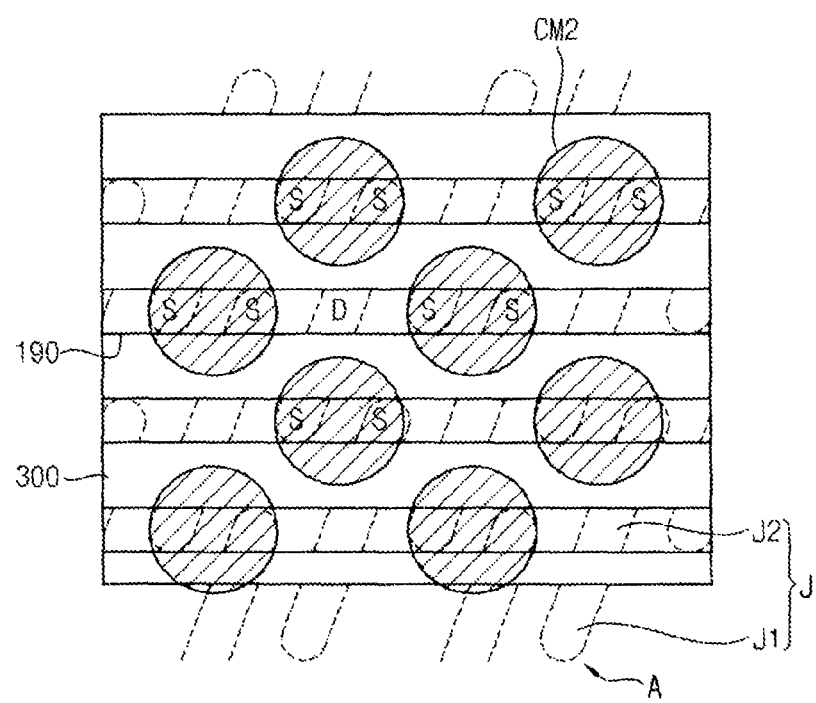

FIGS. 18A and 18B are plan views illustrating the contact hole mask pattern on the first insulation interlayer pattern shown in FIGS. 13A to 13C.

Referring to FIGS. 18A and 18B, the contact hole mask pattern may include a drain exposure mask pattern CM1 by which the first insulation interlayer just corresponding to the drain junction D may be exposed and the rest of the first insulation interlayer may be covered and a source cover mask pattern CM2 by which the first insulation interlayer just corresponding to the source junction S may be covered and the rest of the first insulation interlayer may be exposed.

The first insulation interlayer, the drain junction D under the first insulation interlayer and the device isolation layer 200 and the sealing line 400 around the drain junction D may be partially removed from the substrate 100 by an etching process using the drain exposure mask pattern CM1 or the source cover mask pattern CM2.

In some example embodiments, the drain junction D may be etched off to a depth corresponding to the sealing depth Ds of the sealing line 400 by using the source cover mask pattern CM2, so a top surface of the drain junction D may be coplanar with the upper surfaces of the capping line 330 and the gate insulation pattern 310.

Therefore, the first contact hole H1 may be defined by the sealing line 400 and the device isolation layer 200 as well as the first insulation interlayer pattern 500.

The first insulation interlayer pattern 500 may comprise insulation materials such as silicon nitride and silicon oxynitride and the neighboring first contact structures C1 and the second conductive lines 600, which will be described hereinafter, may be electrically isolated from each other by the first insulation interlayer pattern 500.

In some example embodiments, the first contact hole H1 may be formed by using the source cover mask pattern CM2 in which the insulation interlayer layer corresponding to four source regions J2 around a single drain region J1 may be covered and the drain region J2 and the neighbors thereof enclosed by the four source regions J1 may be exposed. In some example embodiments, if and/or when the first insulation interlayer pattern 500 may have the same nitride materials as the sealing line 400 and the sealing line 400 may be formed under the first insulation interlayer pattern 500, no conductive materials for the first contact structure C1 may remain around the first contact structure C1 after a gate bit line etching (GBL) process even though the source cover mask pattern CM2 may be slightly misaligned with the source regions J1 and thus the source cover mask pattern CM2 may be partially overlapped with the underlying gate insulation pattern 310. Therefore, the first contact structure C1 may be sufficiently limited and/or prevented from being electrically connected with the second contact structure C2 via residuals of the conductive materials of the first contact structure C1.

Figure 14A:
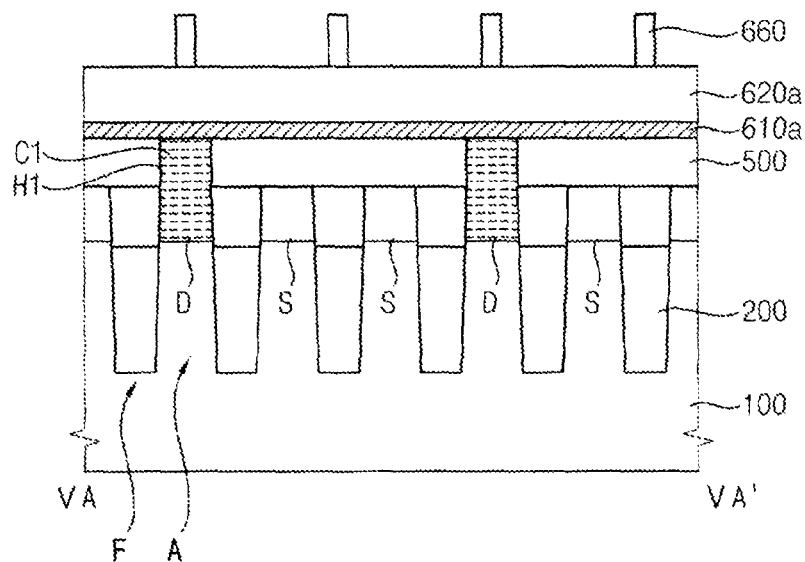
FIGS. 14A to 14C are cross-sectional views illustrating a process operation for a method of manufacturing memory devices including the semiconductor device shown in FIG. 1 in accordance with some example embodiments of the present inventive concepts.
Figure 14B:
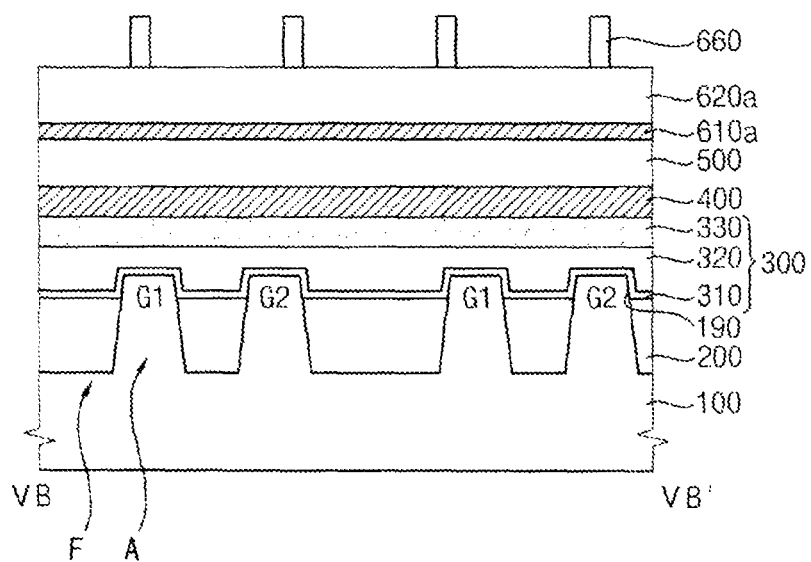
Figure 14C:
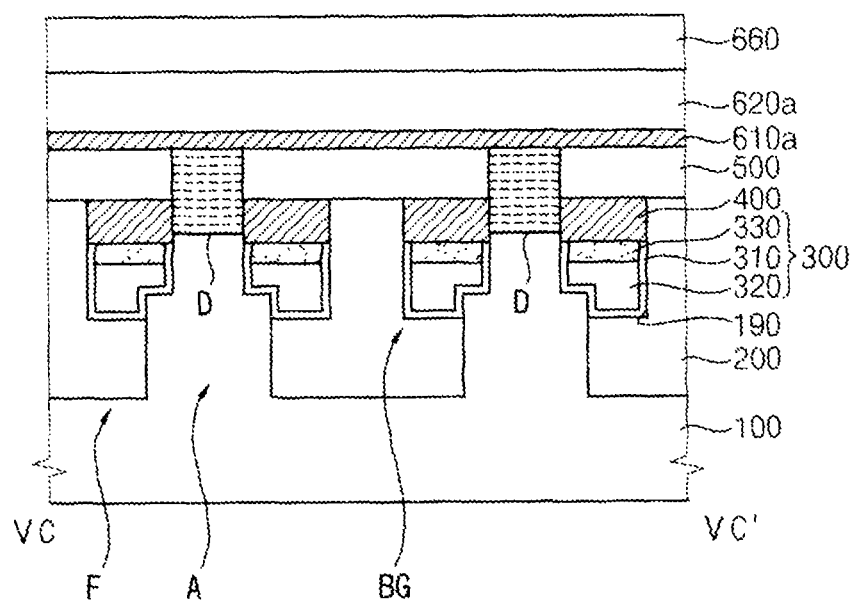

Referring to FIGS. 14A to 14C, the contact hole mask pattern CM1 or CM2 may be removed from the first insulation interlayer pattern 500 and a first conductive layer (not shown) may be formed on the first insulation interlayer pattern 500 to a sufficient thickness to fill up the first contact hole H1. Then, the first conductive layer may be planarized by an etch-back process until a top surface of the first insulation interlayer pattern 500 may be exposed. Thus, the first conductive layer may remain just in the first contact hole H1, to form the first contact structure C1 in the first contact hole H1. For example, the first contact structure may include a direct contact comprising polysilicon and/or a metal silicide.

Thereafter, a second conductive layer 610a and a mask layer 620a may be sequentially stacked on the first insulation interlayer pattern 500 through which the first contact structure C1 may be formed. The second conductive layer 610a may comprise a low-resistive metal such as aluminum (Al) and copper (Cu) and the mask layer 620a may comprise an insulation material such as silicon oxide, silicon nitride and silicon oxynitride.

Then, a photoresist pattern 660 having a width smaller than that of the first contact structure C1 may be formed on the mask layer 620a in such a way that the photoresist pattern is shaped into a plurality of lines extending in the second direction y and spaced apart by the same interval in the first direction x. A central line of the photoresist pattern 660 may be aligned with a central portion of the first contact structure C1 and may cover a central portion of the first contact structure C1 due to the smaller width thereof.

Figure 15A:
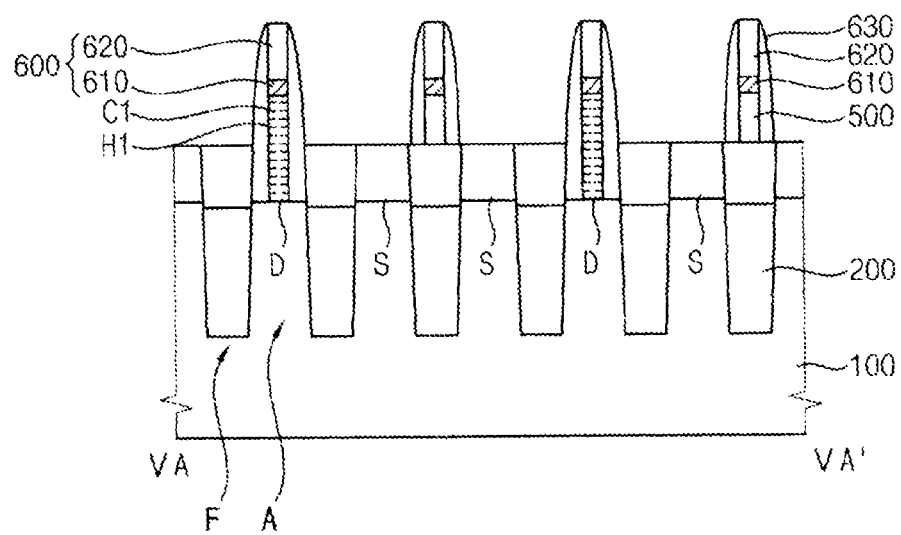
FIGS. 15A to 15C are cross-sectional views illustrating a process operation for a method of manufacturing memory devices including the semiconductor device shown in FIG. 1 in accordance with some example embodiments of the present inventive concepts.
Figure 15B:
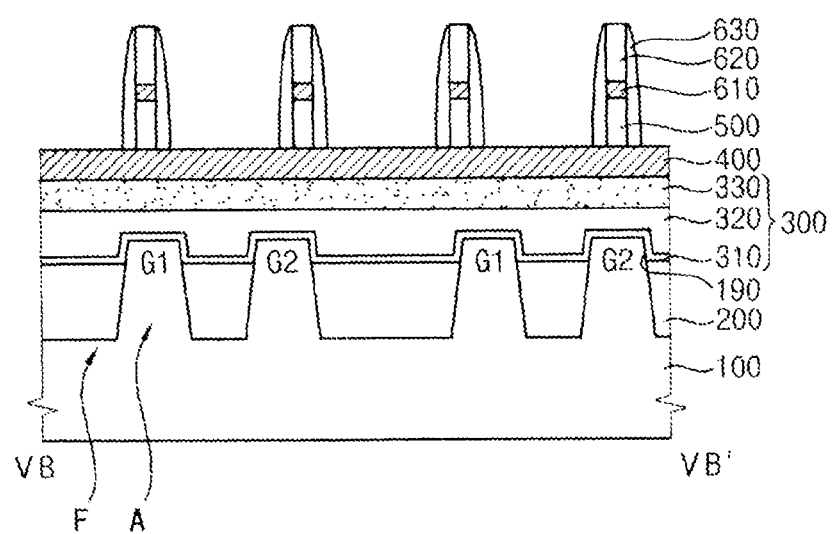
Figure 15C:
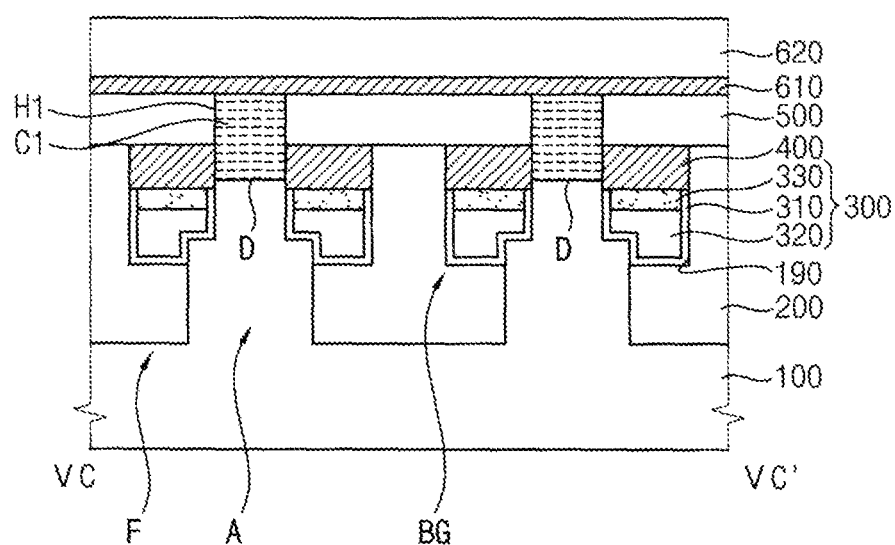

Referring to FIGS. 15A to 15C, the mask layer 620a, the second conductive layer 610a, the first contact structure C1 may be sequentially and partially removed from the substrate 100 by an etching process (GBL etching process) using the photoresist pattern 660 as an etching mask.

Thus, the mask layer 620a, the second conductive layer 610a, the first contact structure C1 may be sequentially removed from the drain junction D and the neighbors thereof and the mask layer 620a and the second conductive layer 610a may be sequentially removed from the device isolation layer 200 and the sealing line 400 at the rest of the substrate 100 except the drain junction D and the neighbors thereof. Therefore, the mask layer 620a and the second conductive layer 610a may be formed into a bit line mask 620 and a bit line 610, respectively, thereby forming the second conductive line having the bit line 610 and the bit line mask 620 and extending in the second direction y. The bit line 610 making contact with the first contact structure C1 may be formed on the same surface as the top surface of the source junction S, so that bit line 610 may be formed into a gate bit line (GBL).

In such a case, the width of the first contact structure C1 may be reduced in the first contact hole H1 to the same width as the bit line 610, so that the peripheral portion of the first contact hole H1 may be exposed again in the GBL etching process. That is, the reduced first contact hole H1 may be arranged just at the central portion of the first contact hole H1 and the rest of the first contact hole H1 may be exposed again in the GBL etching process.

Then, a spacer insulation layer (not shown) may be formed on the substrate 100 in such a way that the peripheral portion of the first contact hole H1 may be filled with the spacer insulation layer and the second conductive line 600 may be covered with the second insulation layer. Thereafter, an isotropic etching process may be performed to the spacer insulation layer, thereby forming a line spacer 630 on both sidewalls of the second conductive line 600.

Thus, the first contact structure C1 under the bit line 610 may be covered by the line spacer 630 and the line spacer 630 may be defined by the sealing line 400 along the first direction x. Therefore, the source and drain junctions S and D may be sufficiently separated from each other by insulation materials in spite of the size reduction of the semiconductor device 1000.

In some example embodiments, if and/or when the sealing line 400 and the first insulation interlayer pattern 500 may have the same side surface of the first contact hole H1 without any substantial stepped portions, the first contact structure C1 may be sufficiently from the first contact hole H1 in the GBL etching process even though the contact hole mask pattern may be misaligned with the underlying active regions A, thereby sufficiently limiting and/or preventing the bridge defect between the source and drain junctions via the residuals of the first contact hole C1 in the GBL etching process.

Figure 16A:
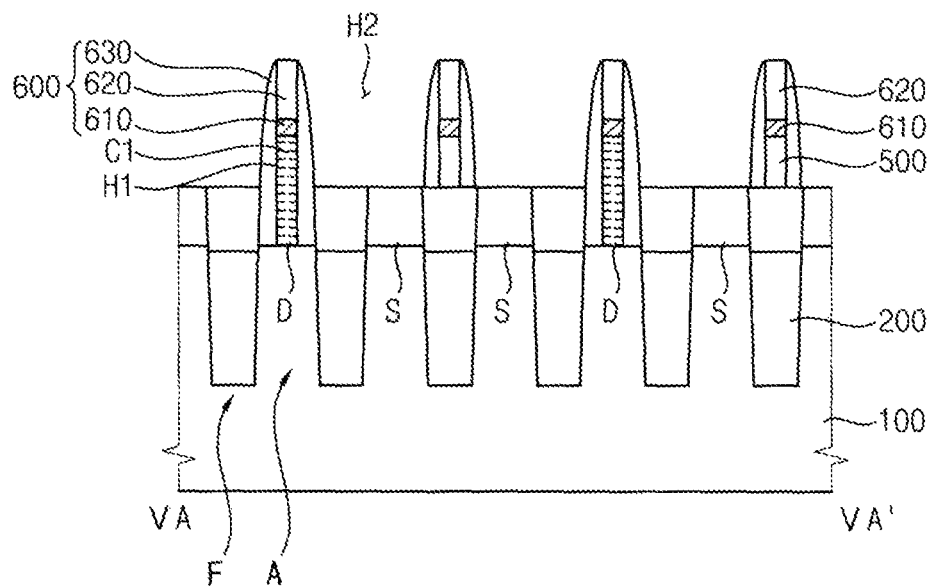
FIGS. 16A to 16C are cross-sectional views illustrating a process operation for a method of manufacturing memory devices including the semiconductor device shown in FIG. 1 in accordance with some example embodiments of the present inventive concepts.
Figure 16B:
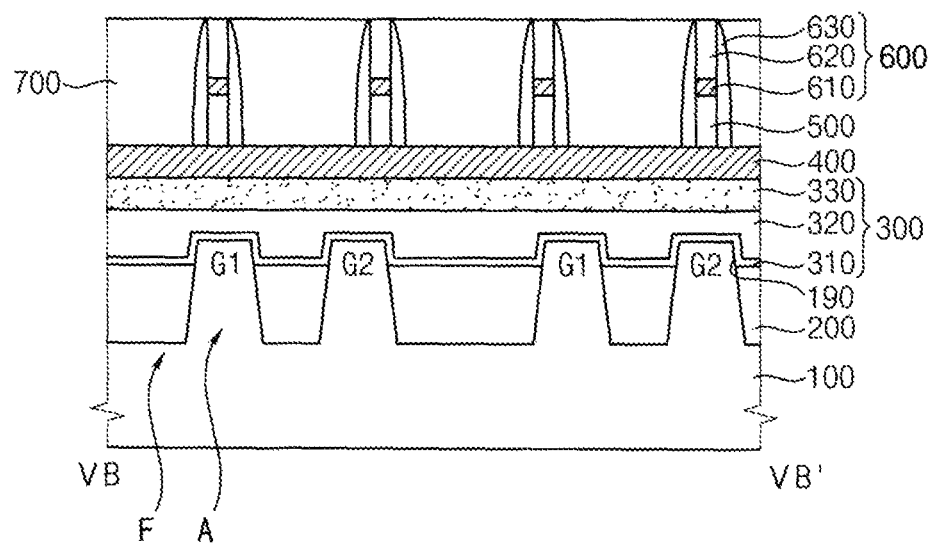
Figure 16C:
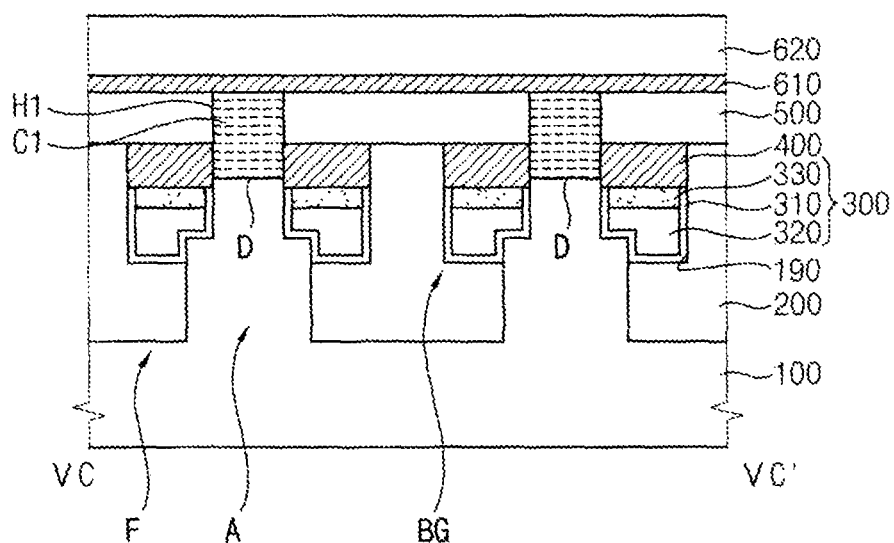

Referring to FIGS. 16A to 16C, a second insulation interlayer (not shown) may be formed on the substrate 100 including the second conductive line 600 to a sufficient thickness to fill up a gap space between the neighboring second conductive lines 600. Then, the second insulation interlayer may be planarized until a top surface of the second conductive line 600 may be exposed. Thus, the second insulation interlayer may remain just in the gap space between the neighboring second conductive lines 600, thereby forming a second insulation interlayer pattern 700 filling up the gap space between the neighboring second conductive lines 600 and electrically isolating the neighboring second conductive lines 600. Then, the second insulation interlayer pattern 700 may be partially removed from the substrate 100, thereby forming a second contact hole H2 through which the source junction S may be exposed.

Figure 17A:
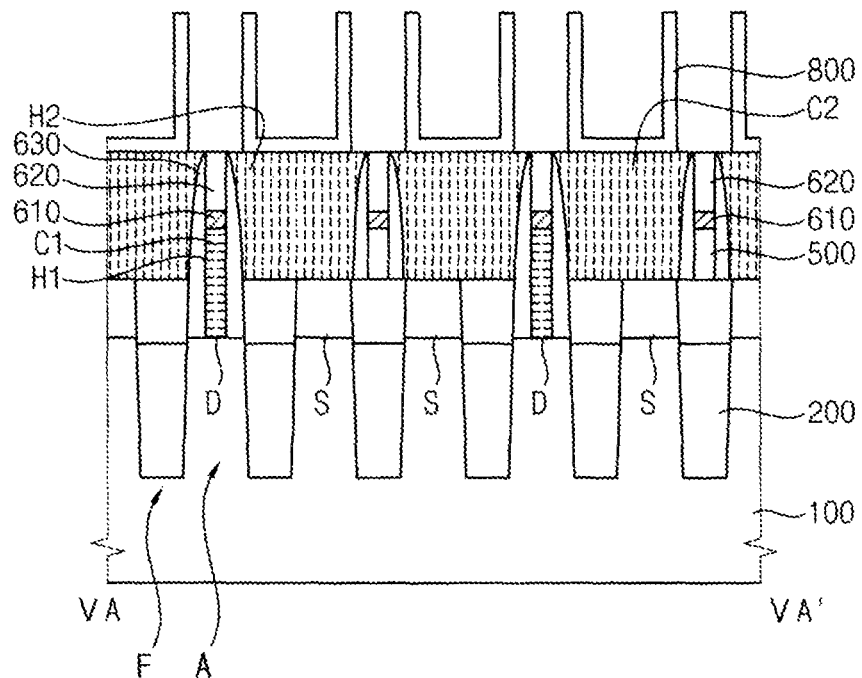
FIGS. 17A to 17C are cross-sectional views illustrating a process operation for a method of manufacturing memory devices including the semiconductor device shown in FIG. 1 in accordance with some example embodiments of the present inventive concepts.
Figure 17B:
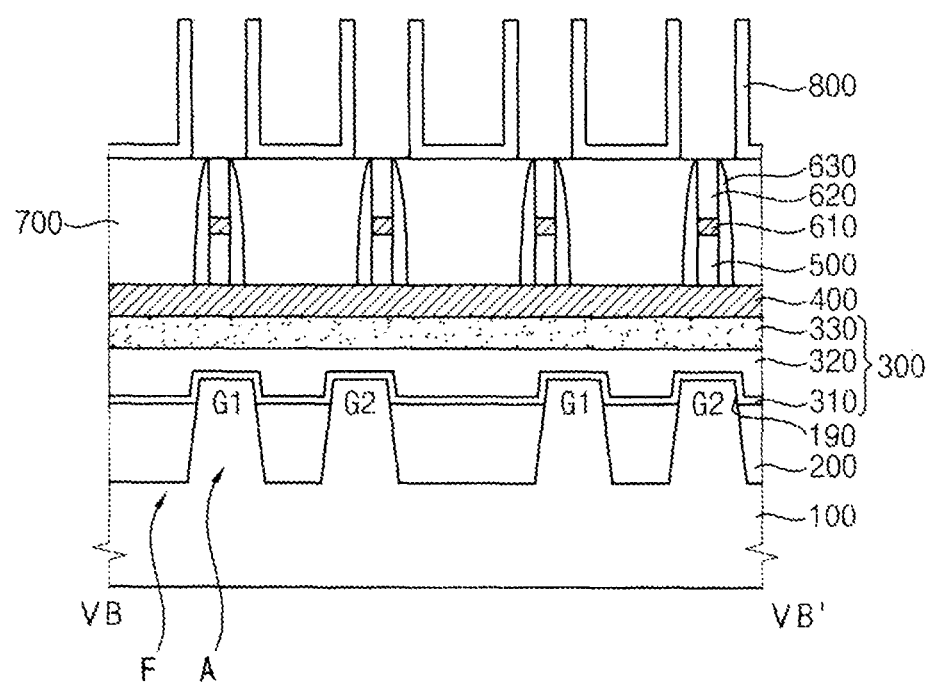
Figure 17C:
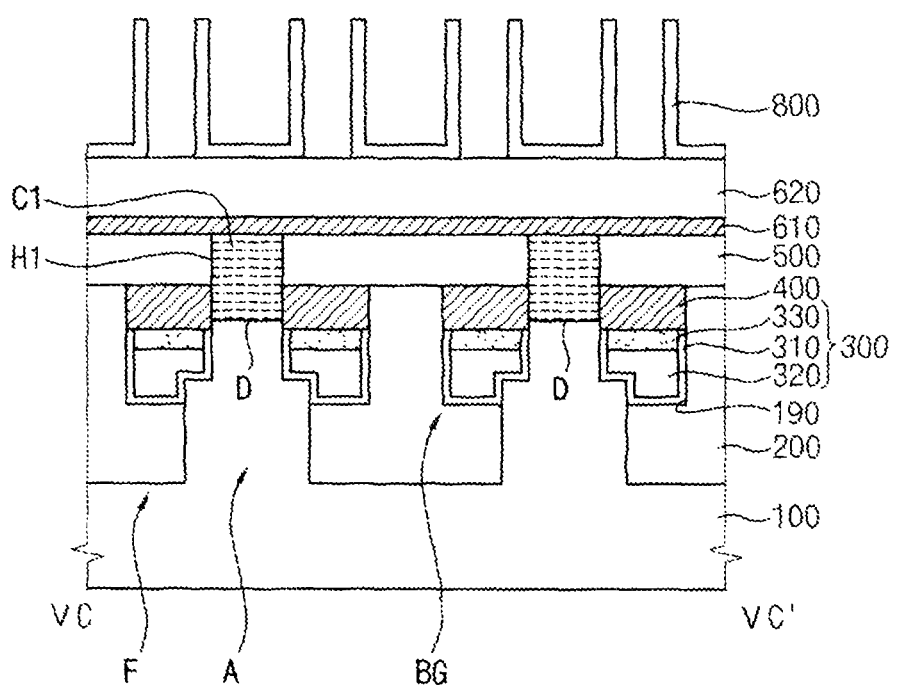

Referring to FIGS. 17A to 17C, a third conductive layer (not shown) may be formed on the second insulation interlayer pattern 700 to a sufficient thickness to fill up the second contact hole H2 and may be planarized by a planarization process until an upper surface of the second insulation interlayer pattern 700 may be exposed, thereby forming a second contact structure C2 in the second contact hole H2. Thereafter, a charge storage element 800 may be formed on the second insulation pattern 700 in such a way that the second contact structure C2 may make contact with the charge storage element 800. For example, the charge storage element 800 may include a capacitor having a lower electrode making contact with the second contact structure C2, a dielectric layer on the lower electrode and an upper electrode on the dielectric layer.

According to some example embodiments of the semiconductor device and the method of manufacturing the same, the gate insulation pattern and the capping line may be removed from an upper portion of the gate trench and the upper portion of the gate trench may be filled up with the sealing line comprising insulation materials, so the gate insulation pattern around the drain junction may be replaced with insulation materials. Accordingly, the insulation thickness around the drain junction may increase as much as the thickness of the gate insulation pattern.

Thus, an etching process for forming a contact hole through which the drain junction may be exposed may be performed with a sufficient process margin due to the increased insulation thickness around the drain junction, thereby increasing the stability and reliability of the bit line contact making contact with the drain junction. In some example embodiments, if and/or when the capping line and the sealing may be vertically stacked on the gate line in the gate trench, the gate line may be sufficiently protected in the etching process for forming a bit line contact hole, thereby limiting and/or preventing the damage to the gate line in the etching process.

In some example embodiments, no residuals of the gate insulation pattern may be found around the drain junction after the etching process for forming the bit line contact hole, the bit line contact may be sufficiently limited and/or prevented from making contact with the residuals of the gate insulation pattern around the drain junction. Thus, the operation reliability of the semiconductor device may not be deteriorated in spite of the high integration degree and size reduction of the semiconductor device.

Some example embodiments of the sealing layer at the upper portion of the gate trench may be applied to various electronic industry fields such as the semiconductor memory, display driving integrated chips (DDI), and communication integrated chips.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   a substrate including an active region at least partially defined by a device isolation layer and at least one gate trench, the at least one gate trench linearly extending in a first direction to cross the active region, the active region including,
      a plurality of gate areas at a bottom of the gate trench,
      a first junction area at a surface of the substrate in a central portion of the active region, and
      a second junction area at a surface of the substrate at opposite end portions of the active region;
   a first conductive line located in the gate trench, the first conductive line extending in the first direction, the first conductive line including,
      a gate line in a lower portion of the gate trench, and
      a capping line on the gate line in the gate trench, the capping line including silicon nitride (SiN); and
   a sealing line located in an upper portion of the gate trench, the sealing line extending in the first direction, the sealing line being on the first conductive line, the sealing line including one of silicon nitride and silicon boron nitride (SiBN).

2. The semiconductor device of claim 1, further comprising:
   a residual gate insulation pattern between the sealing line and an upper sidewall of the gate trench.

3. The semiconductor device of claim 1, further comprising:
   a first contact structure on the first junction area;
   a second conductive line on the first contact structure, the second conductive line contacting the first contact structure and extending in a second direction that is different from the first direction;
   a second contact structure on the second junction area; and
   a charge storage element on the second contact structure, the charge storage element contacting the second contact structure.

4. The semiconductor device of claim 3, wherein,
   the first contact structure includes a direct contact (DC) at least partially enclosed by both the sealing line and the device isolation layer on the first junction area; and
   the second conductive line includes a gate bit line (GBL) contacting the DC and extending in a direction substantially perpendicular to the gate line.

5. The semiconductor device of claim 3, wherein,
   the second contact structure includes a buried contact (BC) contacting the second junction area of the substrate; and
   the charge storage element includes a capacitor contacting with the BC.

6. The semiconductor device of claim 1, wherein,
   the active region is slanted with respect to the first direction.

7. A semiconductor device, comprising:
   a substrate including an active region at least partially defined by a device isolation layer and at least one gate trench, the at least one gate trench linearly extending in a first direction to cross the active region;
   a first conductive line located in the gate trench, the first conductive line extending in the first direction, the first conductive line including,
      a gate line in a lower portion of the gate trench, and
      a capping line on the gate line in the gate trench, the capping line including silicon nitride (SiN), such that
         an upper surface of the first conductive line at least partially includes an upper surface of the capping line, and
         the capping line isolates the gate line from the upper surface of the first conductive line; and
   a sealing line on the first conductive line, the sealing line covering an entirety of an upper surface of the first conductive line, the sealing line including one of silicon nitride and silicon boron nitride (SiBN).

8. The semiconductor device of claim 7, further comprising:
   a residual gate insulation pattern between the sealing line and an upper sidewall of the gate trench.

9. The semiconductor device of claim 7, wherein,
   the active region includes,
      a plurality of gate areas at a bottom of the gate trench,
      a first junction area at a surface of the substrate in a central portion of the active region, and
      a second junction area at a surface of the substrate at opposite end portions of the active region.

10. The semiconductor device of claim 9, further comprising:
- a first contact structure on the first junction area;
- a second conductive line on the first contact structure, the second conductive line contacting the first contact structure and extending in a second direction that is different from the first direction;
- a second contact structure on the second junction area; and
- a charge storage element on the second contact structure, the charge storage element contacting the second contact structure.

11. The semiconductor device of claim 10, wherein,
the first contact structure includes a direct contact (DC) at least partially enclosed by both the sealing line and the device isolation layer on the first junction area; and
the second conductive line includes a gate bit line (GBL) contacting the DC and extending in a direction substantially perpendicular to the gate line.

12. A semiconductor device, comprising:
- a substrate including an active region at least partially defined by a device isolation layer and at least one gate trench, the at least one gate trench linearly extending in a first direction to cross the active region;
- a first conductive line located in the gate trench, the first conductive line extending in the first direction, the first conductive line including,
- a gate line in a lower portion of the gate trench, and
- a capping line on the gate line in the gate trench, the capping line including silicon nitride (SiN); and
- a sealing line located in an upper portion of the gate trench, the sealing line extending in the first direction, the sealing line covering an entirety of an upper surface of the first conductive line, the sealing line including one of silicon nitride and silicon boron nitride (SiBN).

13. The semiconductor device of claim 12, further comprising:
- a residual gate insulation pattern between the sealing line and an upper sidewall of the gate trench.

14. The semiconductor device of claim 12, wherein,
the active region includes,
- a plurality of gate areas at a bottom of the gate trench,
- a first junction area at a surface of the substrate in a central portion of the active region, and
- a second junction area at a surface of the substrate at opposite end portions of the active region.

15. The semiconductor device of claim 14, further comprising:
- a first contact structure on the first junction area;
- a second conductive line on the first contact structure, the second conductive line contacting the first contact structure and extending in a second direction that is different from the first direction;
- a second contact structure on the second junction area; and
- a charge storage element on the second contact structure, the charge storage element contacting the second contact structure.

16. The semiconductor device of claim 15, wherein,
the first contact structure includes a direct contact (DC) at least partially enclosed by both the sealing line and the device isolation layer on the first junction area; and
the second conductive line includes a gate bit line (GBL) contacting the DC and extending in a direction substantially perpendicular to the gate line.

* * * * *